(12) United States Patent
Tsuda et al.

(10) Patent No.: US 6,891,201 B2
(45) Date of Patent: May 10, 2005

(54) NITRIDE SEMICONDUCTOR LASER ELEMENT AND OPTICAL DEVICE CONTAINING IT

(75) Inventors: Yuhzoh Tsuda, Tenri (JP); Takayuki Yuasa, Ikoma-gun (JP); Shigetoshi Ito, Ikoma (JP); Mototaka Taneya, Nara (JP); Yukio Yamasaki, Daito (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/466,339

(22) PCT Filed: Jan. 9, 2002

(86) PCT No.: PCT/JP02/00062

§ 371 (c)(1),
(2), (4) Date: Jul. 14, 2003

(87) PCT Pub. No.: WO02/056435

PCT Pub. Date: Jul. 18, 2002

(65) Prior Publication Data

US 2004/0113141 A1 Jun. 17, 2004

(30) Foreign Application Priority Data

Jan. 15, 2001 (JP) .......................................... 2001-6745
Feb. 8, 2001 (JP) ..................................... 2001-032274

(51) Int. Cl.[7] .............................................. H01L 33/00
(52) U.S. Cl. ............................. 257/88; 257/79; 438/30; 438/46
(58) Field of Search ...................... 257/79, 88; 438/30, 438/46

(56) References Cited

FOREIGN PATENT DOCUMENTS

| JP | 08-064870 | 8/1996 |
| JP | 2000-021789 | 1/2000 |
| JP | 2000-124500 | 4/2000 |
| JP | 2000-183462 | 6/2000 |

OTHER PUBLICATIONS

Shin–ichi Nagahama et al., Jpn. J. Appl. Phys., vol. 39 (2000), "High–Power and Long–Lifetime InGaN Multi–Quantum–Well Laser Diodes Grown on Low–Dislocation–Density GaN Substrates" Part 2, No. 7A, Jul. 1, 2000, pp L647–L650.

Primary Examiner—Long Pham
(74) Attorney, Agent, or Firm—Morrison & Foerster LLP

(57) ABSTRACT

A nitride semiconductor light emitting device includes a processed substrate (101a) including a groove and a hill formed on a main surface of a nitride semiconductor substrate, a nitride semiconductor underlayer (102) covering the groove and the hill of the processed substrate, and a light emitting device structure having a light emitting layer (106) including a quantum well layer or a quantum well layer and a barrier layer in contact with the quantum well layer between an n type layer (103–105) and a p type layer (107–110) over the nitride semiconductor underlayer. A current-constricting portion of the light emitting device structure is formed above a region more than 1 μm away from the center of the groove in the width direction and more than 1 μm away from the center of the hill in the width direction.

28 Claims, 13 Drawing Sheets

NITRIDE SEMICONDUCTOR LASER ELEMENT AND OPTICAL DEVICE CONTAINING IT

TECHNICAL FIELD

The present invention relates to a nitride semiconductor laser device having an improved lasing lifetime, and an optical apparatus including the same.

BACKGROUND ART

Japanese Patent Laying-Open No. 2000-124500 discloses a way of improving light emitting characteristics of a nitride semiconductor laser device, wherein periodic protrusions are formed with a GaN layer stacked on a sapphire substrate, the protrusions are covered flatly with a GaN underlayer, and a gallium nitride-based semiconductor laser device is formed on the GaN underlayer. It also describes that the sapphire substrate may be replaced with a GaN substrate.

Jpn. J. Appl. Phys., Vol. 39, 2000, pp. L647–650 teaches a way of improving an output and a lifetime of a nitride semiconductor laser device, wherein a GaN underlayer is grown to cover a mask pattern of periodic stripe $SiO_2$ masks formed over a main surface of a GaN substrate and windows unprovided with the $SiO_2$ mask, and the nitride semiconductor laser device is formed on the GaN underlayer. According to the article, threading dislocations within the GaN underlayer decrease in a region above the $SiO_2$ mask, and use of the underlayer region containing such less threading dislocations can improve the output and the lifetime of the laser device.

However, it is still desired to improve the lasing lifetime even in the nitride semiconductor laser devices as described above. In view of the foregoing, a major object of the present invention is to provide a nitride semiconductor laser device having a long lasing lifetime.

DISCLOSURE OF THE INVENTION

According to an aspect of the present invention, a nitride semiconductor laser device includes a processed substrate including grooves and hills formed on a main surface of a nitride semiconductor substrate, a nitride semiconductor underlayer covering the grooves and the hills of the processed substrate, and a light emitting device structure having a light emitting layer including a quantum well layer or a quantum well layer and a barrier layer in contact with the quantum well layer between an n type layer and a p type layer over the nitride semiconductor underlayer. A current-constricting portion of the light emitting device structure is formed above a region more than 1 μm away from the center of the groove in the width direction and more than 1 μm away from the center of the hill in the width direction.

The current-constricting portion is more preferably formed above a region more than 1 μm away from the center of the groove in the width direction and within the width of the groove. The current-constricting portion may be formed above a region more than 1 μm away from the center of the groove in the width direction and across the groove and the hill.

At least one of the widths of the groove and the hill is preferably in a range of 4–30 μm. Further, the width of the groove is preferably wider than the width of the hill, and the depth of the groove is preferably in a range of 1–10 μm.

According to another aspect of the present invention, a nitride semiconductor laser device includes a mask substrate including a mask pattern formed on a main surface of a nitride semiconductor substrate. The mask pattern includes a plurality of stripe masks and a plurality of stripe windows arranged alternately. The mask is formed of a growth inhibiting film suppressing epitaxial growth of a nitride semiconductor layer thereon, and the window is unprovided with the growth inhibiting film. The nitride semiconductor laser device further includes a nitride semiconductor underlayer covering the mask pattern, and a light emitting device structure having a light emitting layer including a quantum well layer or a quantum well layer and a barrier layer in contact with the quantum well layer between an n type layer and a p type layer over the underlayer. A current-constricting portion of the light emitting device structure is formed above a region more than 1 μm away from the center of the mask in the width direction and more than 1 μm away from the center of the window in the width direction.

The current-constricting portion is more preferably formed above a region more than 1 μm away from the center of the mask in the width direction and within the width of the mask. The current-constricting portion may be formed above a region across the mask and the window.

The width of the mask is preferably more than 5 μm and less than 30 μm. The width of the window is preferably more than 2 μm and less than 20 μm. The width of the mask is preferably wider than the width of the window.

In either aspect of the present invention described above, the nitride semiconductor underlayer preferably includes $Al_xGa_{1-x}N$ ($0.01 \leq x \leq 0.15$) or $In_xGa_{1-x}N$ ($0.01 \leq x \leq 0.18$). Further, the quantum well layer preferably contains at least one of As, P and Sb. Still further, the nitride semiconductor substrate and the nitride semiconductor underlayer may contain at least one impurity selected from Si, O, Cl, S, C, Ge, Zn, Cd, Mg and Be in a concentration range of more than $5 \times 10^{17}/cm^3$ and less than $5 \times 10^{18}/cm^3$.

The nitride semiconductor laser device of the present invention can advantageously be used in various optical apparatuses.

Figure 1:
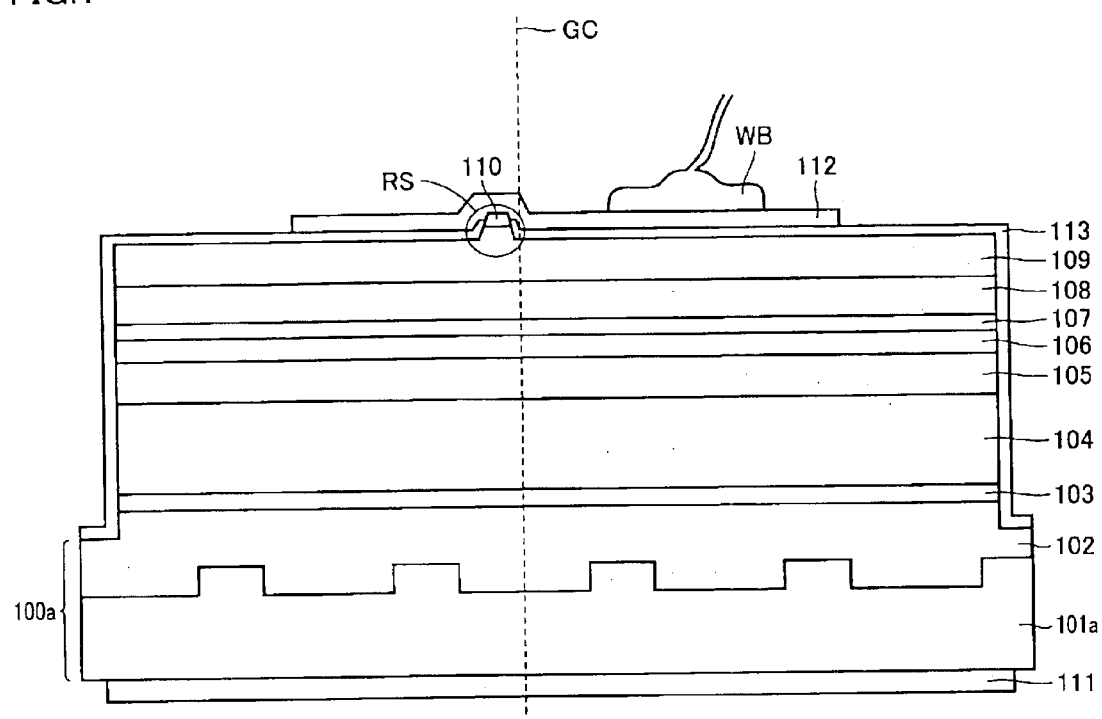
FIG. 1 is a schematic cross sectional view showing an example of a nitride semiconductor laser device including a ridge stripe structure formed on a covered processed substrate according to the present invention.

In the drawings of the present application, the same or corresponding portions are denoted by the same reference characters. In the drawings of the present application, the dimensional relationships in length, width, thickness and others are arbitrarily changed for the purposes of clarification and simplification of the drawings, rather than showing the actual dimensional relationships.

BEST MODES FOR CARRYING OUT THE INVENTION

Hereinafter, several terms are defined before description of various embodiments of the present invention.

Figure 2A:
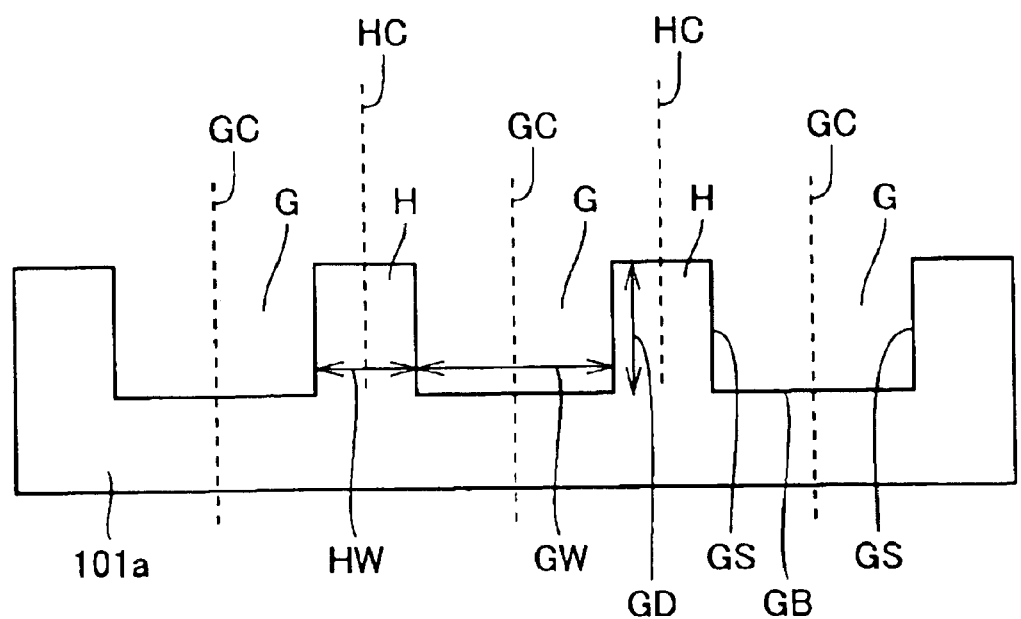
FIG. 2A is a schematic cross sectional view showing an example of a processed nitride semiconductor substrate usable in the present invention.

Firstly, a "groove" refers to a stripe-like concave portion formed on a main surface of a nitride semiconductor substrate. Similarly, a "hill" refers to a stripe-like convex portion (see, e.g., FIG. 2A). The groove and hill do not necessarily have rectangular cross sections as shown in FIG. 2A. They may have V or any other shapes that cause steps.

A "nitride semiconductor substrate" refers to a substrate including $Al_xGa_yIn_zN$ ($0 \leq x \leq 1$; $0 \leq y \leq 1$; $0 \leq z \leq 1$; $x+y+z=1$). Less than about 10% of the nitrogen element included in the nitride semiconductor substrate may be substituted with at least one of As, P and Sb (provided that the hexagonal crystal system of the substrate is maintained). Further, the nitride semiconductor substrate may be doped with at least one impurity selected from Si, O, Cl, S, C, Ge, Zn, Cd, Mg and Be.

A "processed substrate" refers to a nitride semiconductor substrate having a main surface on which grooves and hills are formed. The grooves and hills may be periodic, or they may have varied widths. Further, the grooves may have the same depth or varied depths.

A "nitride semiconductor underlayer" refers to a nitride semiconductor film which covers a processed substrate, and includes $Al_xGa_yIn_zN$ ($0 \leq x \leq 1$; $0 \leq y \leq 1$; $0 \leq z \leq 1$; $x+y+z=1$). Similarly as in the case of the nitride semiconductor substrate, less than about 10% of the nitrogen element included in the nitride semiconductor underlayer may be substituted with at least one of As, P and Sb. Further, the underlayer may be doped with at least one impurity selected from Si, O, Cl, S, C, Ge, Zn, Cd, Mg and Be.

Figure 3:
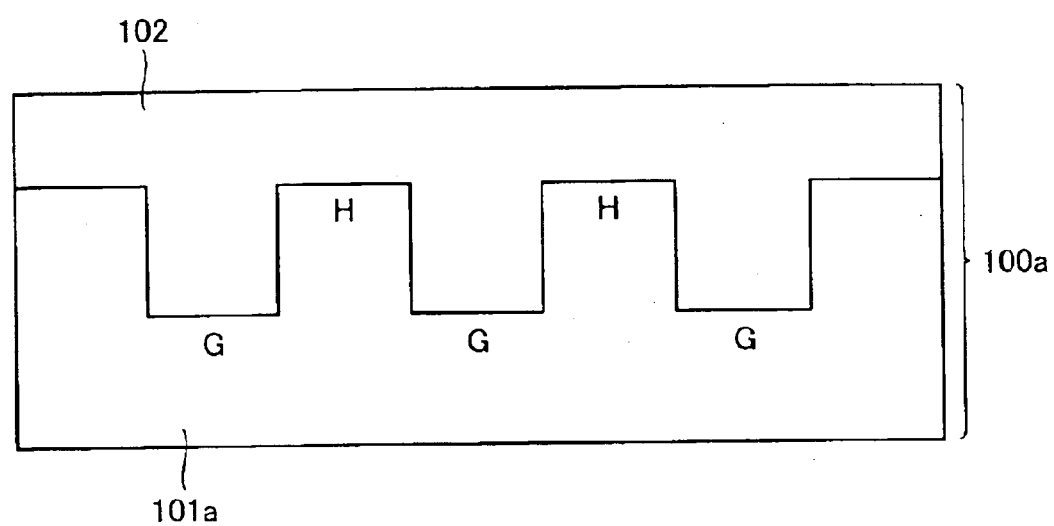
FIG. 3 is a schematic cross sectional view showing an example of a covered processed substrate usable in the present invention.

A "covered processed substrate" refers to an improved substrate including a processed substrate and a nitride semiconductor underlayer covering the processed substrate (see FIG. 3).

A "light emitting layer" refers to a layer which includes at least one quantum well layer or a plurality of barrier layers stacked alternately with the quantum well layers and which can emit light. The light emitting layer of a single quantum well structure is formed of only a single well layer or formed of stacked layers of barrier layer/well layer/barrier layer. The light emitting layer of a multiple quantum well structure includes a plurality of well layers and a plurality of barrier layers stacked alternately with each other.

A "light emitting device structure" refers to a structure which includes, in addition to a light emitting layer, an n type layer and a p type layer sandwiching the light emitting layer.

Figure 4A:
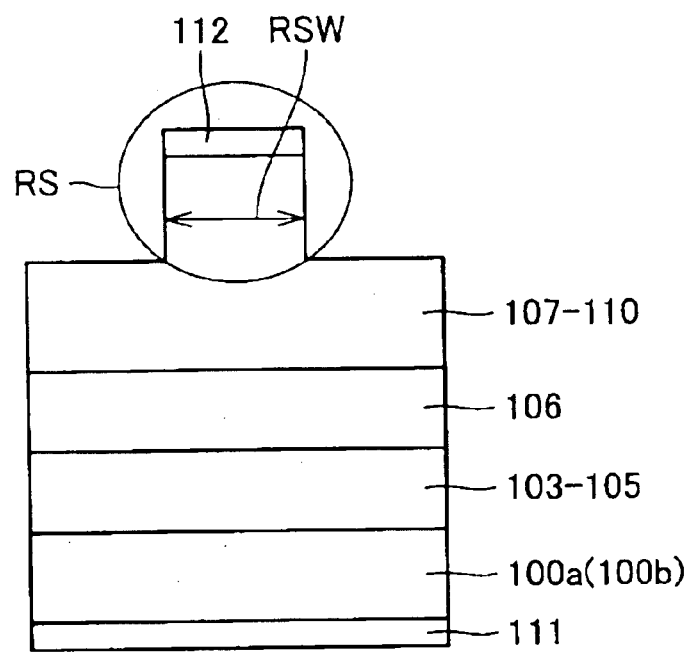
FIG. 4A is a schematic cross sectional view showing an example of a nitride semiconductor laser device having a ridge stripe structure.
Figure 4B:
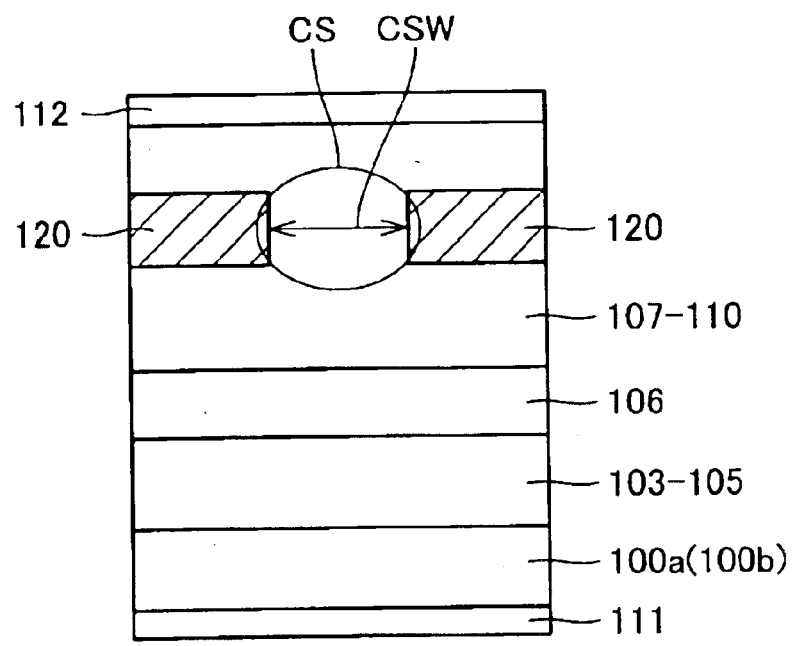
FIG. 4B is a schematic cross sectional view showing an example of a nitride semiconductor laser device including a current-blocking layer structure.

A "current-constricting portion" refers to a portion through which substantial electric current is introduced into a light emitting layer via a p type layer or an n type layer, and a "current-constricting width" refers to a width of the current-constricting portion. For example, in the case of a nitride semiconductor laser device having a ridge stripe structure, the current-constricting portion corresponds to a ridge stripe portion (RS) as shown in FIG. 4A, and the current-constricting width corresponds to a ridge stripe width (RSW). In the case of a nitride semiconductor laser device including a current-constricting layer, the current-constricting portion corresponds to a portion (CS) sandwiched between a pair of current-blocking layers 1 as shown in FIG. 4B, and the current-constricting width corresponds to a width (CSW) of the portion between the current-blocking layers.

A "growth inhibiting film" refers to a film on which epitaxial growth of a nitride semiconductor layer is unlikely to occur. For example, the growth inhibiting film can be formed with a dielectric film, or more specifically, $SiO_2$, $SiN_x$, $Al_2O_3$ or $TiO_2$.

A "window" refers to a portion where a substrate is exposed, not covered with a mask pattern formed of growth inhibiting film.

Figure 10:
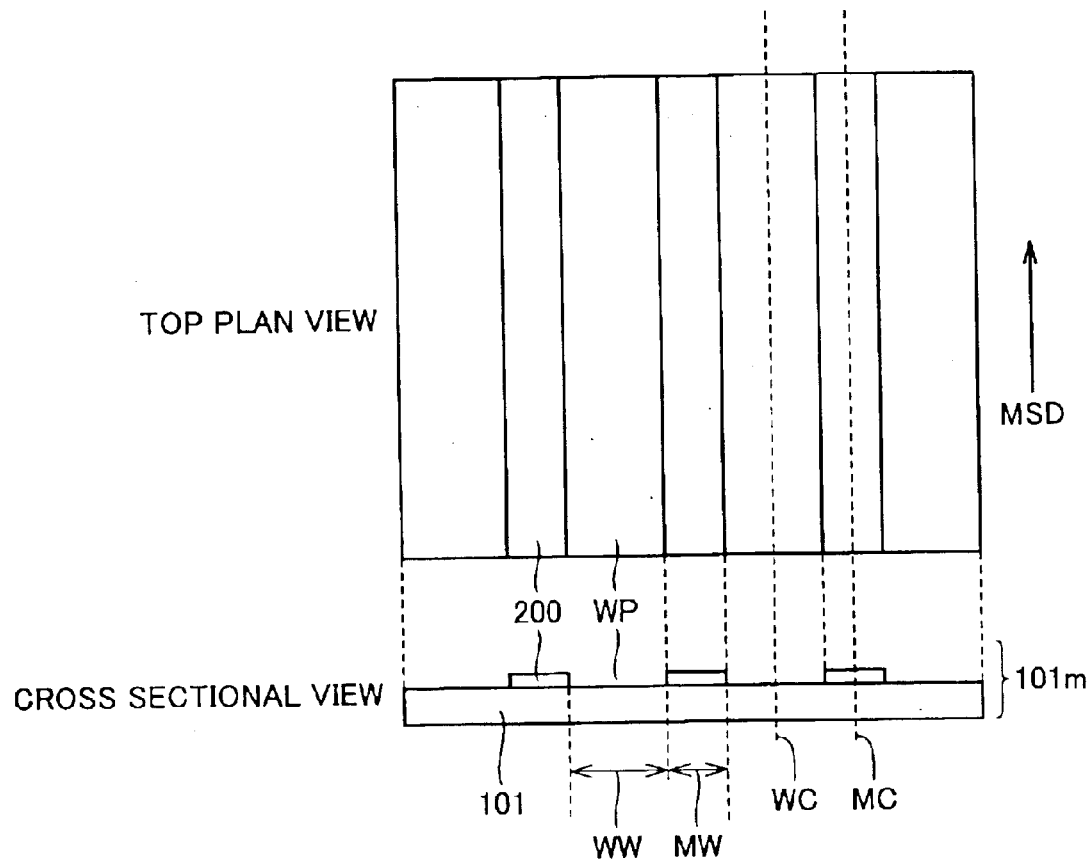
FIG. 10 shows schematic top plan view and cross sectional view of an example of a mask substrate usable in the present invention.

A "mask substrate" refers to a nitride semiconductor substrate having a main surface on which a mask pattern of growth inhibiting film is formed (see FIG. 10).

Figure 11:
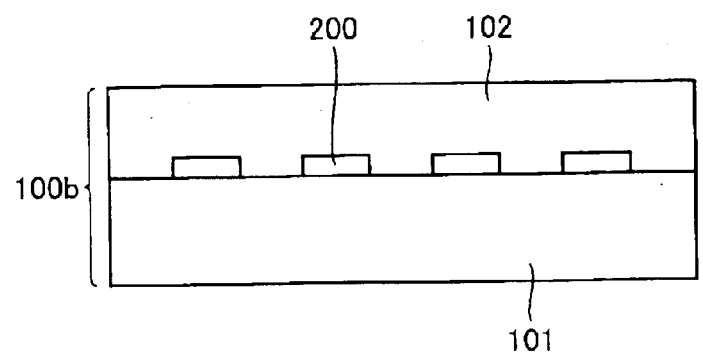
FIG. 11 is a schematic cross sectional view showing an example of a filmed mask substrate usable in the present invention.

A "filmed mask substrate" refers to an improved substrate which includes a nitride semiconductor underlayer covering a mask pattern on a mask substrate (see FIG. 11).

[First Embodiment]

A nitride semiconductor laser device according to a first embodiment includes a processed substrate including grooves and hills formed on a main surface of a nitride semiconductor substrate, a nitride semiconductor underlayer covering the grooves and hills of the processed substrate, and a light emitting device structure having a light emitting layer including a quantum well layer or a quantum well layer and a barrier layer in contact with the quantum well layer between an n type layer and a p type layer over the nitride semiconductor underlayer. The light emitting device structure has a current-constricting portion that is formed above a region more than 1 μm away from the center of a groove on the processed substrate in the width direction and more than 1 μm away from the center of a hill in the width direction. This can improve the lasing lifetime of the nitride semiconductor laser device.

The effect of the present invention can be obtained only when the processed substrate of a nitride semiconductor is employed, for the following reasons. A nitride semiconductor underlayer grown on a processed substrate of a material other than the nitride semiconductor (hereinafter, referred to as a "non-nitride substrate") suffers strong stress strain compared to the one grown on the processed substrate of the nitride semiconductor, since difference in thermal expansion coefficient between the non-nitride substrate and the nitride semiconductor underlayer is considerably greater than that between the nitride semiconductor substrate and the nitride semiconductor underlayer. As such, in the case that the nitride semiconductor substrate is replaced with a non-nitride substrate, even if the current-constricting portion is formed within an optimal region defined in the present invention, crystal strain within the nitride semiconductor underlayer covering the processed substrate and crystal strain within the light emitting device structure are not alleviated sufficiently. In addition, the very large difference in thermal expansion coefficient between the non-nitride substrate and the nitride semiconductor underlayer may cause bowing of the non-nitride substrate itself. If the substrate on which the light emitting device structure is to be formed is bowed, it becomes difficult to form the current-constricting portion of the nitride semiconductor laser device in a prescribed position with good reproducibility.

(Optimal Position for Current-Constricting Portion)

According to a result of detailed investigation of the inventors, it has been found that the lasing lifetime changes dependent on the position at which the current-constricting portion of the nitride semiconductor laser device is formed over the covered processed substrate.

Figure 5:
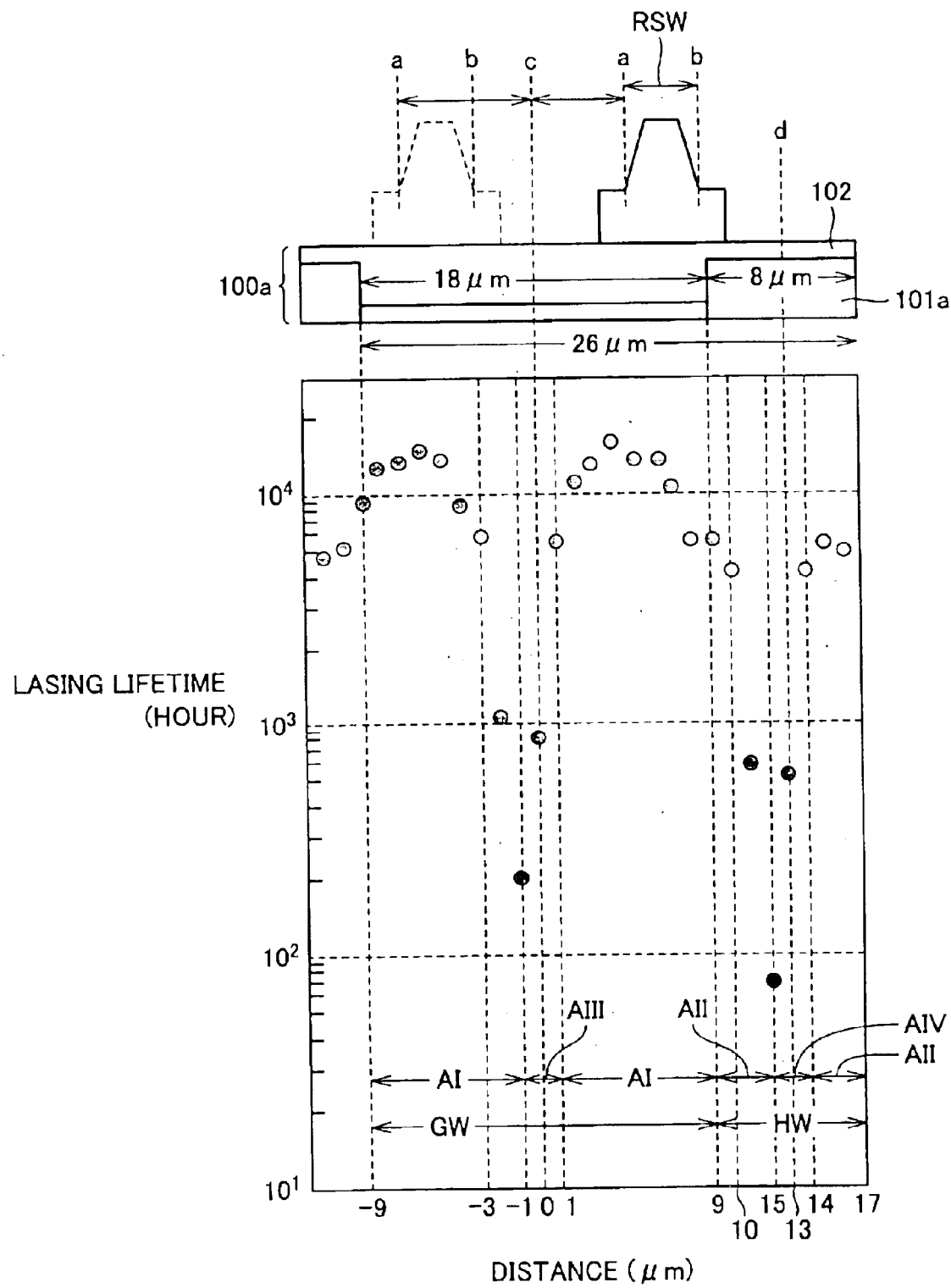
FIG. 5 shows relation between the position of the ridge stripe portion and the lasing lifetime of the nitride semiconductor laser device formed on the covered processed substrate usable in the present invention.

Referring to FIG. 5, the horizontal axis of the graph represents the distance from a groove center (c) of the covered processed substrate to a ridge stripe edge (a) in the width direction, and the vertical axis represents the lasing lifetime. Here, the distance from the groove center (c) to the ridge stripe edge (a) (hereinafter, called c-a distance) is expressed by the positive value on the right side of the groove center (c) and by the negative value on the left side thereof. Further, the lasing lifetime is determined as a time period when the threshold current increases from an initial value to 1.5 times of the initial value after the laser device is set in a lifetime testing apparatus. The nitride semiconductor laser device measured in FIG. 5 is structured and produced similarly as in the case of the second embodiment which will be described later. The ridge stripe width (RSW), the groove width (GW), the hill width (HW), and the groove depth are set to be 2 μm, 18 μm, 8 μm, and 2.5 μm, respectively.

As seen from FIG. 5, the lasing lifetime of the nitride semiconductor laser device tends to extend more in the case that the ridge stripe portion is formed above the groove than in the case that it is formed above the hill. According to a result of more detailed investigation of the inventors, it has been found that the lasing lifetime is decreased dramatically when the ridge stripe portion is formed in a region above the groove where the c-a distance is more than −3 μm and less than 1 μm. Here, when the c-a distance of −3 μm is expressed in terms of a distance from the groove center (c) to a ridge stripe edge (b) (hereinafter, called c-b distance) taking account of the ridge stripe width (RSW) of 2 μm, the c-b distance becomes −1 μm. This means that the lasing lifetime is decreased remarkably when the ridge stripe portion of the nitride semiconductor laser device is formed such that at least a part thereof is included in a range of less than 1 μm on each side of the groove center c in the width direction.

The region (in the range of less than 1 μm on each side of the groove center c in the width direction) where the lasing lifetime is decreased dramatically is called a region AIII. Thus, the ridge stripe portion of the nitride semiconductor laser device is preferably formed such that its entire portion (a-b width) is included in a range other than region AIII. It is more preferable that the ridge stripe portion is formed in a region more than 2 μm away from the groove center c in the width direction. In this case, it may be considered that the width of region AIII is enlarged to be less than 4 μm. Here, in the groove width (GW) range, a range outside region AIII including the groove center (c) is called a region AI. Region AI corresponds to a region where a nitride semiconductor laser device having a long lasing lifetime can be formed even compared to a region AII which will be described later.

The description for the region above the groove is also applicable to the region above the hill. Specifically, the lasing lifetime of the nitride semiconductor laser device is decreased dramatically when the ridge stripe portion of the laser device is formed in a region where the c-a distance is more than 10 μm and less than 14 μm. Here, when the c-a distance of 10 μm is expressed in terms of a distance from a hill center (d) to the ridge stripe edge (b) (hereinafter, called d-b distance) taking account of the ridge stripe width (RSW) of 2 μm, the d-b distance becomes 1 μm. Similarly, when the c-a distance of 14 μm is expressed in terms of a distance from the hill center (d) to the ridge stripe edge (a) (hereinafter, d-a distance), the d-a distance becomes 1 μm. This means that the lasing lifetime is decreased considerably when the ridge stripe portion of the nitride semiconductor laser device is formed such that at least a part thereof is included in a range of less than 1 μm on each side of the hill center (d) in the width direction.

The region (in the range of less than 1 μm on each side of the hill center (d) in the width direction) where the lasing lifetime is decreased dramatically is called a region AIV. Thus, it is preferable to form the ridge stripe portion of the nitride semiconductor laser device such that its entire portion (a-b width) is included in a range other than region AIV. It is more preferable that the ridge stripe portion is formed in a region more than 2 μm away from the hill center (d) in the width direction. In this case, the width of region AIV may be considered as less than 4 μm. Here, in the hill width (HW) range, a region outside region AIV including the hill center (d) is called a region AII. The nitride semiconductor laser device having its ridge stripe portion formed in this region AII exhibited a sufficiently long lasing lifetime of a few thousand hours, though the lifetime is shorter than in the case of above-described region AI.

Figure 6:
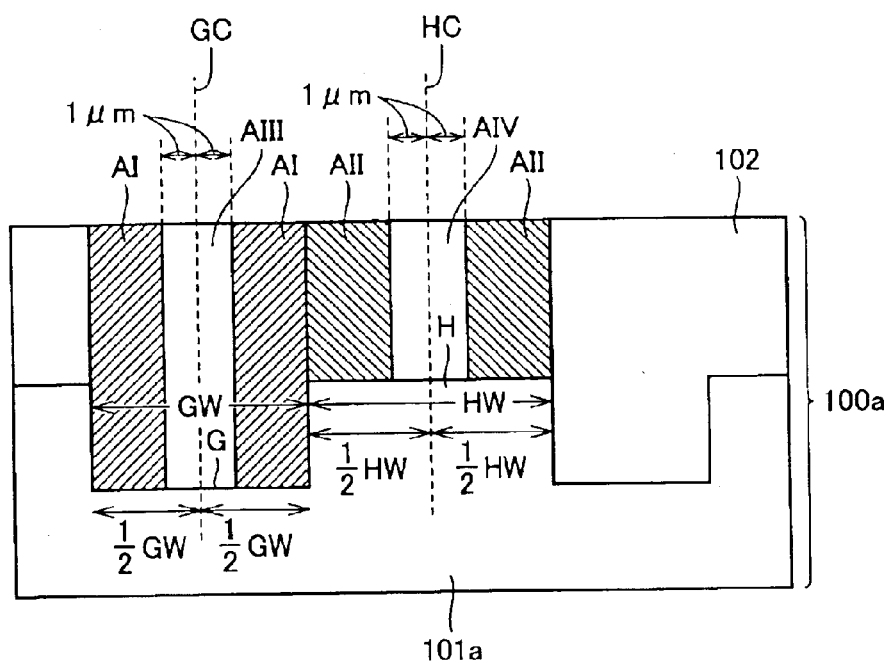
FIG. 6 is a schematic cross sectional view showing regions suitable for forming a current-constricting portion above a covered processed substrate usable in the present invention.

The above-described results are schematically shown in FIG. 6, where regions AI through AIV are shown in a schematic diagram of a covered processed substrate of the present invention. That is, with regard to the covered processed substrate of the present invention, the ridge stripe portion of the nitride semiconductor laser device is preferably formed in a region avoiding at least regions AIII and AIV (i.e., in region AI or AII), most preferably in region AI, and next preferably in region AII. It is also preferable to form the ridge stripe portion across regions AI and AII, since it produces another advantage, in addition to the improvement of the lasing lifetime, that cracks become unlikely to occur in the ridge stripe portion. According to a result of further detailed investigation of the inventors, differential efficiency of the laser device further improved by 60–70% when the ridge stripe portion was formed in region AI, compared to the case that it was formed in region AII.

The reason why the lasing lifetime changes depending on the position of the ridge stripe portion is considered that the degree of alleviation of crystal strain of the light emitting device structure changes depending on the position over the covered processed substrate. The relation as shown in FIG. 5 is obtained even with the ridge stripe width (RSW) of other than 2 μm.

Further, the above-described relation between the position of the ridge stripe portion and the lasing lifetime is not restricted to the nitride semiconductor laser device structure having the ridge stripe structure as shown in, e.g., the schematic cross sectional view of FIG. 4A. For example, in the case of the nitride semiconductor laser device having a pair of current-blocking layers 120 as shown in, e.g., the schematic cross sectional view of FIG. 4B, the above-described ridge stripe portion (RS) corresponds to a portion (CS) between the current-blocking layers, and the ridge stripe width (RSW) corresponds to the width (CSW) of the portion between the current-blocking layers. In more general terms, the effect of the present invention can be obtained as long as the current-constricting portion (the portion of the light emitting layer through which substantial electric current is introduced) contributing to lasing of the nitride semiconductor laser device is located above region AI and/or region AII shown in FIG. 6.

In the case of the nitride semiconductor laser device including the current-blocking structure, however, the lasing lifetime was shorter by about 20–30% compared to the device having the ridge stripe structure described above. Further, the nitride semiconductor laser devices each having the current-blocking structure suffered more significant decrease of their yield due to occurrence of cracks compared to the devices each having the ridge stripe structure. Although the reasons are not clear yet, they may possibly be related to the process of crystal-growing the nitride semiconductor again over the current-blocking layer 120 defining the current-constricting portion. For example, in the process of crystal-growing the nitride semiconductor again over the current-blocking layer, the wafer with the light emitting device structure being formed thereon is temporarily taken out of the crystal-growth system (to room temperature) to form the current-constricting portion in the current-blocking layer, and the wafer is brought into the crystal-growth system again to crystal-grow the remaining light emitting device structure (at about 1000° C.). When such thermal hysteresis involving drastic temperature changes is applied during formation of the light emitting device structure, it is considered that crystal strain within the light emitting device structure would not be alleviated sufficiently and thus cracks would occur even in the nitride semiconductor laser device of the present invention.

(Groove Width)

The width of the groove formed in the processed substrate is preferably more than 4 μm and less than 30 μm, and more preferably more than 11 μm and less than 25 μm. The lower and upper limits of the groove width are estimated as follows. When the current-constricting portion of the nitride semiconductor laser device is formed above a region within the groove width, the lower limit of the groove width depends on the width of the current-constricting portion (current-constricting width). It is preferable, from the standpoint of the longer lasing lifetime described above, that the current-constricting portion is formed in region AI (see FIG. 6). Thus, the lower limit of the groove width (GW) needs to be at least wider than the current-constricting width. The current-constricting width can be formed within the range of about 1–3.5 μm. Thus, it is estimated that the lower limit of the groove width (GW) should be at least more than 4 μm as a sum of the 2 μm width of region AIII and the stripe width (1 μm)×2. Further, it is estimated that the lower limit of the groove width is further preferably more than 11 μm as a sum of the extended 4 μm width of region AIII and the stripe width (3.5 μm)×2.

On the other hand, the upper limit of the groove width (GW) is not set specifically. To completely cover the grooves (H) formed in the processed substrate with nitride semiconductor underlayer 102, however, the groove width is preferably less than 30 μm and more preferably less than 25 μm.

In addition, it is preferable that the groove width is wider than the width (HW) of the hill (H) formed on the processed substrate. In such a case, the region AI most preferable for forming the current-constricting portion becomes wider, allowing a larger number of nitride semiconductor laser devices to be formed therein. The rate of defective nitride semiconductor laser devices also decreases advantageously.

(Hill Width)

In the case that the current-constricting portion is formed above a region within the hill width (HW) (i.e., in region AII) or formed above a region across the hill (H) and the groove (G), the lower and upper limits of the hill width are preferably more than 4 μm and less than 30 μm and more preferably more than 11 μm and less than 25 μm, similarly as in the case of the groove width described above. The benefit of forming the current-constricting portion above the hill (H), however, is less as compared to that in the case of forming the same above the groove (G). Thus, from the standpoint of a longer lasing lifetime, it is preferable to form the current-constricting portion above the groove (i.e., in region AI). In addition, from the standpoint of preventing cracks from occurring in the current-constricting portion, it is preferable to form the current-constricting portion above a region across the hill (H) and the groove (G).

When the current-constricting portion is formed above the groove, the lower limit of the hill width needs to be more than 2 μm corresponding to the width of region AIV, and preferably more than 4 μm corresponding to the extended width of region AIV. Although the upper limit of the hill width is not specifically set when the current-constricting portion is formed above the groove, it is considered that the effect of alleviating crystal strain in the light emitting device structure will increase when the hill width becomes narrower, since the occupying ratio of the groove region on the substrate increases. In view of the foregoing, the upper limit of the hill width (HW) is preferably less than 20 μm and more preferably less than 10 μm.

(Groove Depth)

Figure 7:
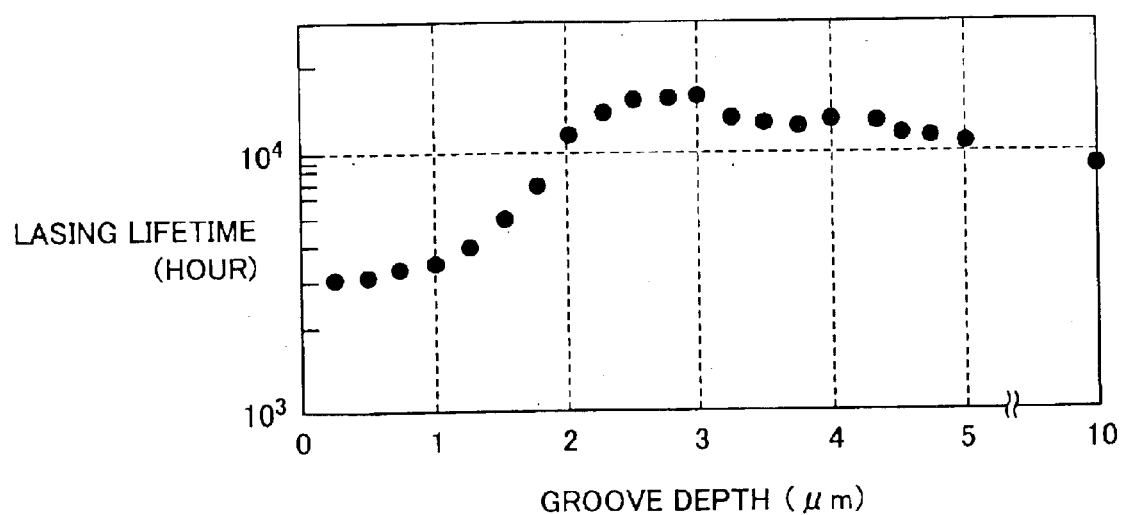
FIG. 7 is a graph showing relation between the groove depth in the processed substrate used in the present invention and the lasing lifetime of the laser device that can be obtained using the processed substrate.

FIG. 7 shows relation between the groove depth and the lasing lifetime. The structure and the forming method of the nitride semiconductor laser devices measured in FIG. 7 are similar as in the second embodiment which will be described later. The groove width, hill width and ridge stripe width are set to 18 μm, 8 μm and 2 μm, respectively. The ridge stripe portion is formed with the c-a distance of 4 μm in region AI (see FIG. 5).

As seen from FIG. 7, the lasing lifetime begins to extend as the groove depth increases to exceed 1 μm. The lasing lifetime further extends and reaches an approximately constant saturation value when the groove depth becomes more than 2 μm. Although the upper limit of the groove depth is not set specifically in terms of the improvement of the lasing lifetime, the groove having a depth of more than about 10 μm is difficult to be covered with the nitride semiconductor underlayer, which may lead to reduction of a region where the nitride semiconductor laser device can be formed. Thus, the groove depth is preferably more than 1 μm and less than 10 μm, and more preferably more than 2 μm and less than 5 μm.

The relation between the groove depth and the lasing lifetime has the tendency similar to that of FIG. 7 as long as the current-constricting portion is formed above region AI and/or region AII.

(Longitudinal Direction of Groove)

The longitudinal direction of the groove formed in a nitride semiconductor substrate having a main surface of a {0001} C plane is most preferably in parallel with the <1-100> direction, and next preferably in parallel with the <11-20> direction. Even when the longitudinal direction of the groove made an angle within about ±5 degrees with such a specific direction in the {0001} C plane, it did not cause any substantial effect.

Formation of the groove in the <1-100> direction of the nitride semiconductor substrate is advantageous in that the effects of suppressing crystal strain and occurrence of cracks are very high. When a nitride semiconductor underlayer is grown in the groove formed in the relevant direction, the groove is covered with the nitride semiconductor underlayer while primarily {11-20} planes grow on the sidewall surfaces of the groove. Since the {11-20} plane of the sidewall surface is perpendicular to the main surface of the substrate, the groove is covered with the nitride semiconductor underlayer while having an approximately rectangular cross section at any time. That is, the nitride semiconductor underlayer is less likely to grow on the bottom surface of the groove, and the groove is covered from the sidewalls thereof. The nitride semiconductor underlayer grows sufficiently in a direction parallel to the main surface of the substrate (hereinafter, called lateral growth). This is presumably the reason why the effects of suppressing crystal strain and occurrence of cracks can be obtained to the great extent.

A still longer lasing lifetime can be obtained by combining the feature of the longitudinal direction of the groove in the <1-100> direction with the feature of the optimal position of the current-constricting portion.

Figure 2B:
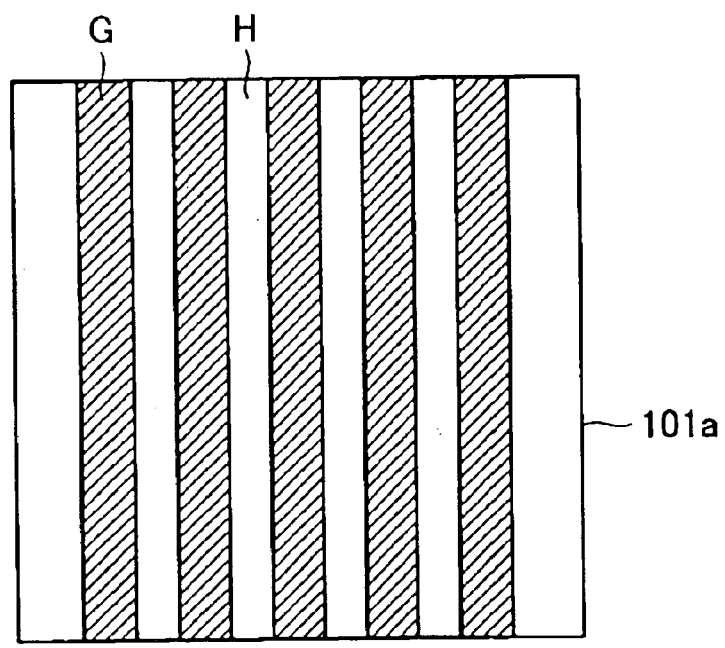
FIG. 2B is a top plan view thereof.

On the other hand, formation of the groove in the <11-20> direction of the nitride semiconductor substrate is advantageous in that, when the groove is filled with the nitride semiconductor underlayer, good surface morphology of the underlayer is ensured above the groove. When the nitride semiconductor underlayer grows within the groove formed in the relevant direction, primarily the {1-101} plane grows on the sidewall surfaces of the groove while covering the groove. The {1-101} plane on the sidewall surface is extremely flat, and the edge portion where the sidewall surface comes into contact with the hill top surface is also extremely sharp. Thus, the groove formed in the <11-20> direction is covered with the nitride semiconductor underlayer, which hardly meanders when seen from above as in FIG. 2B. The nitride semiconductor underlayer has good surface morphology in the region above the groove thus covered. With the good surface morphology of the underlayer of nitride semiconductor film, it becomes possible to favorably decrease the rate of defective nitride semiconductor laser devices each having the current-constricting portion formed in region AI.

The above-described grooves and hills all have stripe shapes, which is advantageous in the following point. The current-constricting portion of the nitride semiconductor laser device has a stripe shape. Thus, if the optimal position (region AI or AII) for forming the current-constricting portion also has a stripe shape, it becomes possible to readily form the current-constricting portion in region AI or AII.

(Nitride Semiconductor Underlayer)

GaN film, AlGaN film, or InGaN film, for example, may be employed as the underlayer of nitride semiconductor film covering the processed substrate. The nitride semiconductor underlayer may be doped with at least one of Si, O, Cl, S, C, Ge, Zn, Cd, Mg and Be.

The nitride semiconductor underlayer of GaN film is preferable in the following points. Firstly, it can be formed in good controllability of crystal growth, since the GaN film is a binary mixed crystal. Further, the surface migration length of the GaN film is longer than that of the AlGaN film and shorter than that of the InGaN film, so that appropriate lateral growth for covering the grooves and hills completely and flatly can be achieved. The GaN film used as the nitride semiconductor underlayer preferably has an impurity concentration in a range of $1 \times 10^{17}/cm^3$ to $5 \times 10^{18}/cm^3$. Addition of the impurity in this concentration range ensures good surface morphology of the nitride semiconductor underlayer and uniform thickness of the light emitting layer, thereby improving the characteristics of the device.

The nitride semiconductor underlayer of AlGaN film is preferable in the following points. The AlGaN film, as it contains Al, has the surface migration length that is shorter than those of the GaN and InGaN films. The shorter surface migration length means that, while the nitride semiconductor underlayer covers the inside of the groove of the processed substrate in the lateral direction, the underlayer is unlikely to be deposited on the bottom of the groove. That is, crystal growth of the AlGaN film from the sidewall of the groove is promoted, resulting in prominent lateral growth, which can further alleviate the crystal strain. The Al composition ratio x of the $Al_xGa_{1-x}N$ film is preferably greater than 0.01 and less than 0.15, and more preferably greater than 0.01 and less than 0.07. If the Al composition ratio x is smaller than 0.01, the above-described surface migration length may become long unfavorably. If the Al composition ratio x is greater than 0.15, the surface migration length may become too short, in which case the groove may not be filled flatly. The effect similar to that of the AlGaN film can be obtained with any nitride semiconductor underlayer containing Al. Further, the AlGaN film used as the nitride semiconductor underlayer preferably has an impurity concentration in a range of $3 \times 10^{17}/cm^3$ to $5 \times 10^{18}/cm^3$. Addition of the impurity in this concentration range in addition to Al ensures a properly short surface migration length of the nitride semiconductor underlayer, in which case the crystal strain can further be alleviated.

The nitride semiconductor underlayer of InGaN film is preferable in the following points. The InGaN film, containing In, is superior in elasticity to the GaN and AlGaN films. Thus, the InGaN film filled in the groove of the processed substrate makes the crystal strain from the nitride semiconductor substrate distributed over the entire nitride semiconductor underlayer, and thus alleviates difference between the crystal strain above the groove and the crystal strain above the hill. That is, the dependency of lasing lifetime on whether the current-constricting portion is formed in region AI or in region AII can be made small. The In composition ratio x of the $In_xGa_{1-x}N$ film is preferably greater than 0.01 and less than 0.18, and more preferably greater than 0.01 and less than 0.1. If the In composition ratio x is smaller than 0.01, the effect of good elasticity due to inclusion of In may not be obtained. If the In composition ratio x is greater than 0.18, the crystallinity of the InGaN film may be degraded. The effect similar to that of the InGaN film can be obtained with any nitride semiconductor underlayer containing In. Further, the InGaN film used as the nitride semiconductor underlayer preferably has an impurity concentration in a range of $1\times10^{17}/cm^3$ to $4\times10^{18}/cm^3$. Addition of the impurity in this concentration range as well as In is advantageous in that the surface morphology of the nitride semiconductor underlayer becomes favorable and the elasticity can also be maintained.

(Thickness of Nitride Semiconductor Underlayer)

To completely cover the processed substrate with the underlayer of nitride semiconductor film, the nitride semiconductor underlayer must be sufficiently thick, preferably more than about 2 μm and less than 20 μm. If the covering film thickness is thinner than 2 μm, it begins to be difficult to embed the groove completely and flatly in the nitride semiconductor underlayer, though it depends on the groove width and the groove depth formed on the processed substrate. On the other hand, if the covering film thickness is thicker than 20 μm, growth in the perpendicular direction (with respect to the main surface of the substrate) gradually becomes more prominent than lateral growth on the processed substrate, in which case it may be difficult to fully enjoy the effect of alleviating the crystal strain and the effect of suppressing occurrence of the cracks.

[Second Embodiment]

In a second embodiment, a nitride semiconductor laser device having a ridge stripe structure is formed on a covered processed substrate. The matters not specifically explained in the present embodiment are similar as explained in the first embodiment.

(Formation of Covered Processed Substrate)

The schematic cross sectional view of FIG. 3 shows a covered processed substrate including a processed substrate covered with an underlayer of nitride semiconductor film. The processed substrate can be formed in the following manner. Firstly, a dielectric film of $SiO_2$ or $SiN_x$ is formed by evaporation on a (0001) main surface of an n type GaN substrate. A resist material is applied over the dielectric film, and a mask pattern of stripes is formed by lithography. Grooves (G) are formed along the mask pattern by dry etching, penetrating the dielectric film into the n type GaN substrate. Thereafter, the resist and dielectric film are removed, so that the processed substrate 101a is completed. The grooves (G) and hills (H) thus formed extend in the <1-100> direction of the n type GaN substrate, and have a groove width, a groove depth and a hill width of 18 μm, 2.5 μm and 8 μm, respectively.

Processed substrate 101a thus formed is subjected to organic cleaning thoroughly, and then transferred into a MOCVD (metallorganic chemical vapor deposition) system, where an underlayer 102 of n type $Al_{0.05}Ga_{0.95}N$ film is grown to a thickness of 6 μm. For formation of this underlayer 102, $NH_3$ (ammonia) as a source material for the group V element and TMGa (trimethyl gallium) and TMAl (trimethyl aluminum) as source materials for the group III elements are supplied over the processed substrate set in the MOCVD system, and $SiH_4$ (Si impurity concentration: $1\times10^{18}/cm^3$) is added to the source materials at a crystal growth temperature of 1050° C.

As the way of forming the grooves (G) and hills (H) on the nitride semiconductor substrate, the resist material may be applied directly over the surface of the nitride semiconductor substrate, without provision of the dielectric film, followed by the steps as described above. According to experiments of the inventors, however, it is preferable to insert the dielectric film, since it can reduce damage to the substrate (particularly to the hill surfaces) during formation of the grooves.

Although the method of forming the grooves by dry etching has been explained in the present embodiment, other groove forming methods may of course be employed, which include, e.g., wet etching, scribing, wire saw processing, electric discharge machining, sputtering, laser beam machining, sand blasting, and focused ion beam machining.

Although the grooves have been formed in the <1-100> direction of the n type GaN substrate in the present embodiment, they may be formed in the <11-20> direction thereof.

Further, although the GaN substrate having a main surface of the (0001) plane has been used in the present embodiment, it is possible to employ another nitride semiconductor substrate and another plane orientation. As to the plane orientation of the nitride semiconductor substrate, a C plane {0001}, an A plane {11-20}, an R plane {1-102}, an M plane {1-100} or a {1-101} plane may be employed preferably. Good surface morphology can be obtained also with a substrate of which main surface has an off-angle of less than 2 degrees from any of these plane orientations.

(Crystal Growth)

FIG. 1 shows a nitride semiconductor laser device grown on a covered processed substrate. This nitride semiconductor laser includes a covered processed substrate 100a composed of a processed substrate (n type GaN substrate) 101a and an n type $Al_{0.05}Ga_{0.95}N$ film 102, an n type $In_{0.07}G_{0.093}N$ anti-crack layer 103, an n type $Al_{0.1}Ga_{0.9}N$ clad layer 104, an n type GaN light guide layer 105, a light emitting layer 106, a p type $Al_{0.3}Ga_{0.7}N$ carrier block layer 107, a p type GaN light guide layer 108, a p type $Al_{0.1}Ga_{0.9}N$ clad layer 109, a p type GaN contact layer 110, an n electrode 111, a p electrode 112, and a $SiO_2$ dielectric film 113. Wire bonding (WB) is carried out on p electrode 112 electrically connected to p type clad layer 109 via a ridge stripe portion (RS).

Using the MOCVD system, $NH_3$ (ammonia) as a source material for the group V element and TMGa (trimethyl gallium) or TEGa (triethyl gallium) as a source material for the group III element are introduced with TMIn (trimethyl indium) as a source material for the group III element and $SiH_4$ (silane) as an impurity over covered processed substrate 100a, to grow n type $In_{0.07}Ga_{0.93}N$ anti-crack layer 103 to a thickness of 40 nm at a crystal growth temperature of 800° C. Next, the substrate temperature is raised to 1050° C., and TMAl (trimethyl aluminum) or TEAl (triethyl aluminum) as a source material for the group III element is provided to grow n type $Al_{0.1}Ga_{0.9}N$ clad layer 104 (Si impurity concentration: $1\times10^{18}/cm^3$) to a thickness of 0.9 μm. N type GaN light guide layer 105 (Si impurity concentration: $1\times10^{18}/cm^3$) is then grown to a thickness of 0.1 μm.

Thereafter, the substrate temperature is lowered to 800° C., to form light emitting layer (of multiple quantum well structure) 106 including 8 nm thick $In_{0.01}Ga_{0.99}N$ barrier layers and 4 nm thick $In_{0.15}Ga_{0.85}N$ well layers stacked alternately with each other. In the present embodiment, light emitting layer 106 has the multiple quantum well structure starting and ending both with the barrier layers, including 3 quantum well layers (i.e., 3 cycles). The barrier and well layers are both doped with Si impurity at a concentration of $1\times10^{18}/cm^3$. A crystal growth break interval of at least one second and at most 180 seconds may be provided between growth of the barrier layer and growth of the well layer, or between growth of the well layer and growth of the barrier layer. This can improve flatness of the respective layers and also decrease the half-width of emission peak in the emission spectrum.

$AsH_3$ (arsine) or TBAs (tertiary butyl arsine) may be used to add As in light emitting layer 106. Similarly, $PH_3$ (phosphine) or TBP (tertiary butyl phosphine) may be used to add P, and TMSb (trimethyl antimony) or TESb (triethyl antimony) may be used to add Sb in light emitting layer 106. $NH_3$ as the source material of N may be replaced with dimethyl hydrazine in the formation of the light emitting layer.

Next, the substrate temperature is raised again to 1050° C. to successively grow 20 nm thick p type $Al_{0.3}Ga_{0.7}N$ carrier block layer 107, 0.1 µm thick p type GaN light guide layer 108, 0.5 µm thick p type $Al_{0.1}Ga_{0.9}N$ clad layer 109, and 0.1 µm thick p type GaN contact layer 110. As the p type impurity, Mg ($EtCP_2Mg$: bisethylcyclopentadienyl magnesium) is added at a concentration from $5\times10^{19}/cm^3$ to $2\times10^{20}/cm^3$. The p type impurity concentration in p type GaN contact layer 110 is preferably increased as approaching the interface with p electrode 112. This can reduce the contact resistance at the interface with the p electrode. Further, oxygen may be added by a minute amount during growth of the p type layers, to remove residual hydrogen in the p type layers that hinders activation of the p type impurity Mg.

After the growth of p type GaN contact layer 110, the entire gas in the reactor of the MOCVD system is replaced with nitrogen carrier gas and $NH_3$, and the substrate temperature is decreased at a cooling rate of 60° C./min. Supply of $NH_3$ is stopped when the substrate temperature is decreased to 800° C. The substrate is maintained at that temperature for five minutes, and then cooled to room temperature. The substrate is temporarily held at a temperature preferably in a range from 650° C. to 900° C., for a time period preferably in a range from 3 minutes to 10 minutes. The cooling rate to the room temperature is preferably more than 30° C./min. The film thus crystal-grown was evaluated by Raman spectroscopy, and it was found that the grown film already had the p type characteristic (with Mg activated), even without conventional annealing for giving the p type characteristic. The contact resistance after formation of p electrode 112 was also reduced. When the conventional annealing for giving the p type characteristic was additionally applied, the activation ratio of Mg further improved favorably.

In the crystal growth method of the present embodiment, crystal growth from the processed substrate to the nitride semiconductor laser device may be carried out continuously. Alternatively, growth from the processed substrate to the covered processed substrate may be carried out in advance, followed by growth for the nitride semiconductor laser device.

$In_{0.07}Ga_{0.93}N$ anti-crack layer 103 of the present embodiment may have the In composition ratio of other than 0.07, or the layer itself may be omitted. However, the InGaN anti-crack layer is preferably inserted when lattice mismatch is large between the clad layer and the GaN substrate.

Although light emitting layer 106 of the present embodiment has the structure starting and ending both with the barrier layers, it may have a structure starting and ending both with the well layers. The number of well layers within the light emitting layer is not restricted to 3 as described above. The threshold current value is low with at most 10 well layers, enabling continuous lasing at room temperature. In particular, the well layers of at least 2 and at most 6 are preferable, ensuring the low threshold current value.

While Si has been added in both the well and barrier layers at a concentration of $1\times10^{18}/cm^3$ in light emitting layer 106 of the present embodiment, it may be added to none of the layers. However, the luminous intensity of the light emitting layer was increased when Si was added therein. At least one of O, C, Ge, Zn and Mg, besides Si, may be employed as the impurity to be added in the light emitting layer. The total impurity dose is preferably on the order of about $1\times10^{17}/cm^3$ to $1\times10^{19}/cm^3$. Further, the impurity may be added only in either of the well and barrier layers, instead of both of the layers.

P type $Al_{0.3}Ga_{0.7}N$ carrier block layer 107 of the present embodiment may have the Al composition ratio of other than 0.3, or the carrier block layer itself may be omitted. The threshold current value, however, was lowered with provision of the carrier block layer, because carrier block layer 107 has a function to confine the carriers in light emitting layer 106. The Al composition ratio of the carrier block layer is preferably set high to enhance the carrier confining effect. When the Al composition ratio is set low within the range guaranteeing the carrier confinement, mobility of the carriers in the carrier block layer increases, leading to favorable reduction of electric resistance.

Although $Al_{0.1}Ga_{0.9}N$ crystals have been employed for p type clad layer 109 and n type clad layer 104 in the present embodiment, the Al composition ratio may be other than 0.1. If the Al composition ratio is increased, differences in energy gap and in refractive index compared with light emitting layer 106 increase, so that carriers and light can be confined in the light emitting layer efficiently, which leads to reduction of the lasing threshold current value. By comparison, if the Al composition ratio is lowered within the range ensuring confinement of carriers and light, mobility of the carriers in the clad layers increases, so that it is possible to reduce operating voltage of the device.

The AlGaN clad layer preferably has a thickness of 0.7–1.5 µm. This ensures a unimodal vertical transverse mode and increases the light confining effect, and further enables improvement in optical characteristics of the laser device and reduction of the lasing threshold current value.

The clad layer is not restricted to the ternary mixed crystal of AlGaN. It may be a quaternary mixed crystal of AlInGaN, AlGaNP, AlGaNAs or the like. Further, the p type clad layer may have a super-lattice structure comprised of p type AlGaN layers and p type GaN layers or a super-lattice structure comprised of p type AlGaN layers and p type InGaN layers for the purpose of reducing its electric resistance.

Although the crystal growth using the MOCVD system has been explained in the present embodiment, molecular beam epitaxy (MBE), hydride vapor phase epitaxy (HVPE) or the like may also be used for the crystal growth.

(Processing Into Chips)

The epi-wafer obtained by the above-described crystal growth (i.e., wafer having nitride semiconductor multiple layer epitaxial-grown on the covered substrate) is taken out of the MOCVD system and processed into laser devices. Here, the surface of the epi-wafer having the nitride semiconductor laser layer formed therein is flat, and the grooves and hills formed on the processed substrate are completely embedded in the nitride semiconductor underlayer and the light emitting device structure layer.

Covered processed substrate 100*a* is a nitride semiconductor of an n type conductivity, so that Hf and Al are deposited in this order on its back side to form n electrode 111 (see FIG. 1). Ti/Al, Ti/Mo, Hf/Au or the like may also be used as the materials for the n electrode. Hf is preferably used for the n electrode to decrease its contact resistance.

The p electrode portion is etched in a stripe manner in the groove direction of processed substrate 101*a*, to form a ridge stripe portion (see FIG. 1). The ridge stripe portion (RS) having a stripe width of 2.0 $\mu$m is formed 4 $\mu$m away from a groove center (GC), avoiding region AIII. Thereafter, $SiO_2$ dielectric film 113 is formed by evaporation, and an upper surface of p type GaN contact layer 110 is exposed from the dielectric film. On the exposed surface of the contact layer, p electrode 112 is formed with stacked layers of Pd/Mo/Au by evaporation. Stacked layers of Pd/Pt/Au, Pd/Au, Ni/Au or the like may also be used for the p electrode.

Lastly, the epi-wafer is cloven in a direction perpendicular to the longitudinal direction of the ridge stripe, to form Fabri-Perot resonators each having a 500 $\mu$m length. In general, the resonator length is preferably in a range from 300 $\mu$m to 1000 $\mu$m. In the case of the grooves being in the <1-100> direction, the mirror end surfaces of the resonator correspond to the M plane {1-100} of the nitride semiconductor crystal. Cleavage for formation of the mirror end surfaces and division into laser chips are carried out with a scriber from the back side of processed substrate 101*a*. The cleavage is done with the scriber, by scratching not the entire back side of the wafer but only portions of the wafer, e.g., only the both ends of the wafer. This prevents degradation of sharpness of the end surfaces and also prevents shavings due to the scribing from attaching to the epi-surface, thereby improving the yield of the devices.

As the feedback method of the laser resonator, commonly known DFB (distributed feedback), DBR (distributed bragg reflector) or the like may also be employed.

After formation of the mirror end surfaces of the Fabri-Perot resonator, dielectric films of $SiO_2$ and $TiO_2$ are alternately formed on one of the mirror end surfaces by evaporation, to make a dielectric multilayer reflection film having a reflectance of 70%. Alternatively, multilayer film of $SiO_2/Al_2O_3$ or the like may be used for the dielectric multilayer reflection film.

Although n electrode 111 has been formed on the back side of covered processed substrate 100*a*, a portion of n type $Al_{0.05}Ga_{0.95}N$ film 102 may be exposed from the front surface of the epi-wafer by dry etching, to form the n electrode in the exposed region.

(Packaging)

The semiconductor laser device chip obtained is mounted to a package. For a nitride semiconductor laser device of high output (greater than 30 mW), attention should be paid to measures for heat dissipation. A high output nitride semiconductor laser device is connected to a package body, preferably with being junction-down, by using an In soldering material. Alternatively, the high output nitride semiconductor laser device may be connected via a sub-mount of Si, AlN, diamond, Mo, CuW, BN, Fe, Cu, SiC, or Au, instead of being directly attached to the package body or a heat sink portion.

The nitride semiconductor laser device of the present embodiment is completed as described above.

Although covered processed substrate 100*a* of GaN has been used in the present embodiment, a covered processed substrate of another nitride semiconductor may be employed. For example, in the case of a nitride semiconductor laser, it is preferable that a layer having a refractive index lower than that of a clad layer is in contact with the outside of the clad layer to obtain a unimodal vertical transverse mode, and an AlGaN substrate may be employed preferably.

In the present embodiment, the nitride semiconductor laser device is formed at the optimal position over the covered processed substrate. Accordingly, crystal strain is alleviated, the rate of occurrence of cracks is decreased, and the lasing lifetime of about 15500 hours is obtained.

[Third Embodiment]

In a third embodiment, a nitride semiconductor laser device is formed including a current-blocking layer instead of the ridge stripe structure (see FIG. 4). The matters not specifically explained in the present embodiment are similar to those of the first and second embodiments.

Hereinafter, the nitride semiconductor laser device including the current-blocking layer of the present embodiment is explained in more detail with reference to FIG. 8. The laser device includes a covered processed substrate 100*a*, an n type $In_{0.07}Ga_{0.93}N$ anti-crack layer 103, an n type $Al_{0.1}Ga_{0.9}N$ clad layer 104, an n type GaN light guide layer 105, a light emitting layer 106, a p type $Al_{0.2}Ga_{0.8}N$ carrier block layer 107, a p type GaN light guide layer 108, a p type $Al_{0.1}Ga_{0.9}N$ first clad layer 109*a*, a current-blocking layer 120, a p type $Al_{0.1}Ga_{0.9}N$ second clad layer 109*b*, a p type GaN contact layer 110, an n electrode 111, and a p electrode 112.

Figure 8:
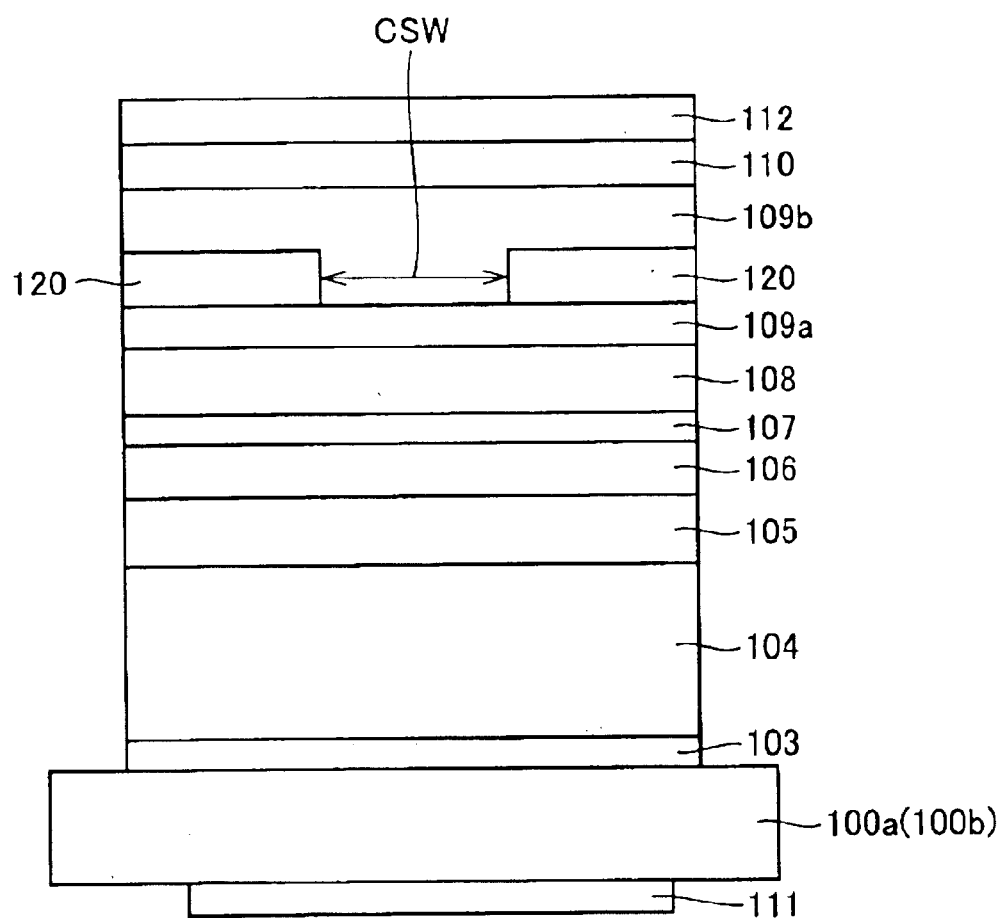
FIG. 8 is a schematic cross sectional view showing an example of a nitride semiconductor laser device including a current-blocking layer.

A pair of current-blocking layer 120 may be any layers that can block electric current introduced from p electrode 112 to let it pass only through a width (CSW) of a gap between the current-blocking layers as shown in FIG. 8. For example, n type $Al_{0.25}Ga_{0.75}N$ layer may be used as current-blocking layer 120, though the Al composition ratio thereof may be other than 0.25.

In the third embodiment, the groove width, the hill width, the groove depth, and the width of the gap between the current-blocking layers were set to 15 $\mu$m, 7 $\mu$m, 3 $\mu$m, and 1.8 $\mu$m, respectively. The gap between the current-blocking layers was arranged 3 $\mu$m away from the groove center (i.e., within region AI). The effects similar to those in the first embodiment were obtained in the third embodiment.

[Fourth Embodiment]

A fourth embodiment is similar to the first and second embodiments except that the grooves and hills explained in the second embodiment are formed on a nitride semiconductor improved substrate which includes a nitride semiconductor base substrate and a nitride semiconductor layer stacked thereon.

In formation of the covered processed substrate of the present embodiment, firstly, an n type GaN base substrate having a (0001) main surface is placed in a MOCVD system. $NH_3$ and TMGa are supplied over the n type GaN base substrate, to form a low-temperature GaN buffer layer at a relatively low growth temperature of 550° C. The growth temperature is raised to 1050° C., and $NH_3$, TMGa and $SiH_4$ are supplied over the low-temperature GaN buffer layer, to form an n type GaN layer. The nitride semiconductor improved substrate having the n type GaN layer formed thereon is then taken out of the MOCVD system. A mask pattern of stripes is formed by lithography over a surface of the n type GaN layer of the improved substrate taken out of the MOCVD system. Grooves are formed along the mask pattern by dry etching, and the processed substrate is thus completed. Here, the grooves and hills were formed on the processed substrate in the <1-100> direction of the n type GaN improved substrate, with a groove width, a groove depth and a hill width of 20 μm, 3 μm and 8 μm, respectively.

The processed substrate is subjected to organic cleaning thoroughly, and then transferred again into the MOCVD system, to grow a GaN underlayer to a thickness of 5 μm. Specifically, $NH_3$ as a source material for the group V element, TMGa as a source material for the group III element, and $SiN_4$ (Si impurity concentration: $1\times10^{18}/cm^3$) as a dopant are supplied over the processed substrate set in the MOCVD system, and the GaN underlayer is deposited at a growth temperature of 1050° C. The covered processed substrate of the fourth embodiment is thus completed.

The low-temperature GaN buffer layer explained in the present embodiment may be a low-temperature $Al_xGa_{1-x}N$ ($0 \leq x \leq 1$) buffer layer, or the layer itself may be omitted. With a GaN substrate commercially available at the present, however, it is preferable to insert the low-temperature $Al_xGa_{1-x}N$ buffer layer to improve the unfavorable surface morphology of the GaN substrate. Here, the low-temperature buffer layer refers to a buffer layer formed at a relatively low growth temperature of 450–600° C. The buffer layer formed at a growth temperature in this range becomes polycrystalline or amorphous.

[Fifth Embodiment]

A fifth embodiment is similar to the first through third embodiments except that a substitutional element of at least one of As, P and Sb is contained in the light emitting layer to substitute for some of N atoms. More specifically, the substitutional element of at least one of As, P and Sb is contained in substitution for some of N atoms in at least the well layer within the light emitting layer of the nitride semiconductor light device. Here, when the total composition ratio of As, P and/or Sb contained in the well layer is expressed by x and the composition ratio of N is expressed by y, x is smaller than y and x/(x+y) is less than 0.3 (30%) and preferably less than 0.2 (20%). The lower limit of the total concentration of As, P and/or Sb is preferably greater than $1\times10^{18}/cm^3$.

This is because, when the composition ratio x of the substitutional element exceeds 20%, concentration separation begins to gradually occur in which the composition ratios of the substitutional element differ in regions within the well layer, and when the composition ratio x exceeds 30%, the concentration separation proceeds to crystal system separation into a hexagonal system and a cubic system, causing an increased possibility of degradation in crystallinity of the well layer. On the other hand, if the total concentration of the substitutional element is smaller than $1\times10^{18}/cm^3$, it is almost impossible to obtain the effect of adding the substitutional element in the well layer.

The present embodiment has an effect that inclusion of the substitutional element of at least one of As, P and Sb in the well layer decreases the effective mass of electrons and holes in the well layer, thereby increasing mobility of the electrons and holes. In the case of a semiconductor laser device, the small effective mass means that carrier population inversion for lasing can be obtained by introducing a small amount of current. The increased mobility means that, even if electrons and holes in the light emitting layer are consumed by luminous recombination, new electrons and holes can be introduced rapidly by diffusion. That is, according to the present embodiment, it is possible to obtain a semiconductor laser having a small threshold current density and exhibiting excellent self-sustained pulsation characteristics (excellent noise characteristics) compared to an InGaN-based nitride semiconductor laser device of which well layer does not contain any of As, P or Sb.

[Sixth Embodiment]

A nitride semiconductor laser device according to a sixth embodiment has a mask substrate including a mask pattern formed on a main surface of a nitride semiconductor substrate. The mask pattern includes a plurality of stripe masks and a plurality of stripe windows arranged alternately with each other. The mask is formed of a growth inhibiting film for suppressing epitaxial growth of a nitride semiconductor layer thereon, and the window is unprovided with the growth inhibiting film. The nitride semiconductor laser device further includes a nitride semiconductor underlayer covering the mask pattern, and a light emitting device structure having a light emitting layer including a quantum well layer or a quantum well layer and a barrier layer in contact with the quantum well layer between an n type layer and a p type layer over the underlayer. The light emitting device structure has a current-constricting portion through which substantial electric current is introduced into the light emitting device structure. The current-constricting portion is formed above a region more than 1 μm away from the center of the mask in the width direction and more than 1 μm away from the center of the window in the width direction. This can improve the lasing lifetime of the nitride semiconductor laser device.

Similarly as in the case of the first embodiment, the effect of the present embodiment by forming the current-constricting portion of the nitride semiconductor laser chip above the mask pattern is obtained only when the substrate included in the mask substrate of the laser chip is formed of a nitride semiconductor.

(Optimal Position for Current-Constricting Portion)

In the sixth embodiment, similarly as in the case of the first embodiment, it has been found that the lasing lifetime changes depending on the position above which the current-constricting portion of the nitride semiconductor laser device is formed over the filmed mask substrate.

Figure 12:
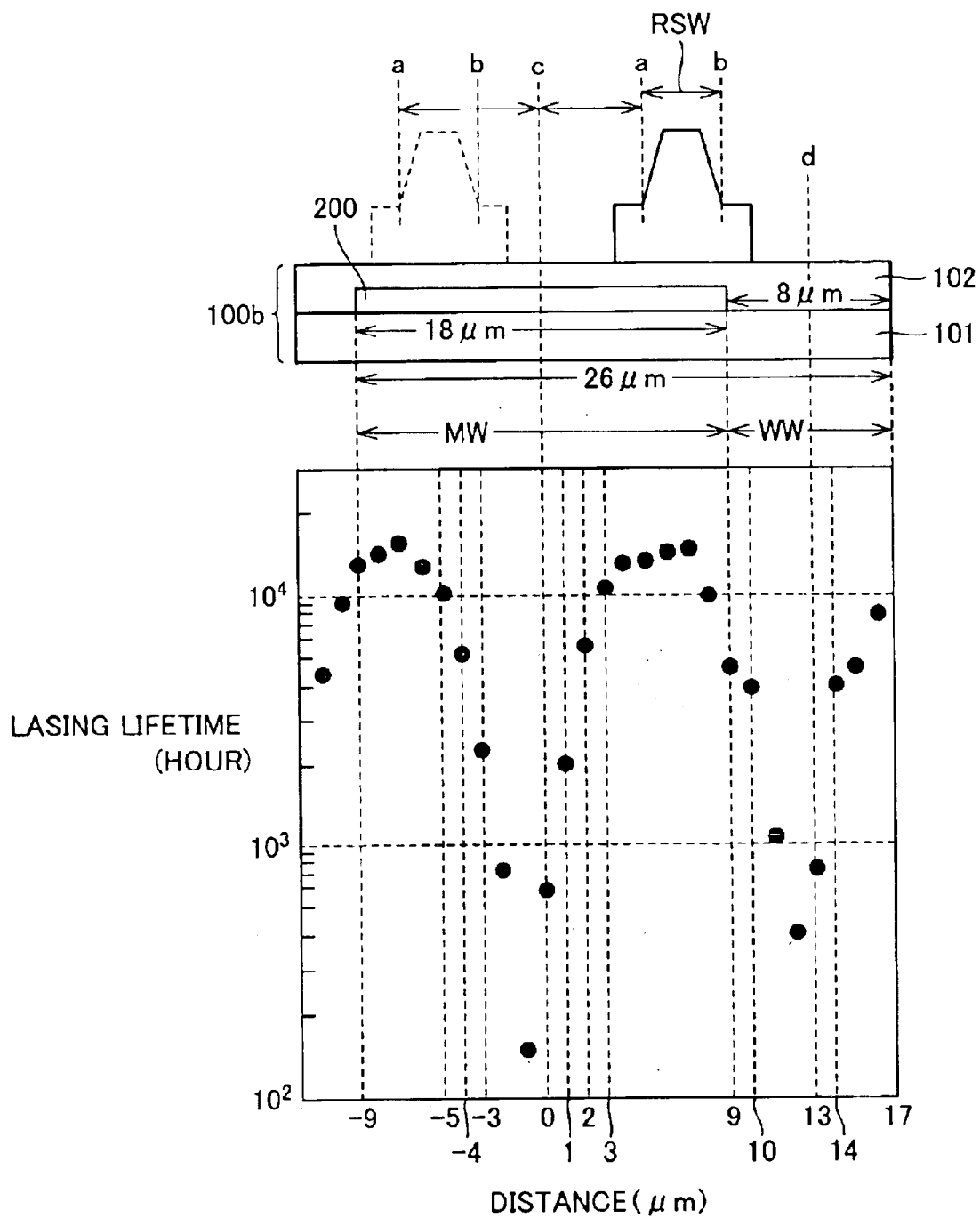
FIG. 12 shows relation between the position of the ridge stripe portion and the lasing lifetime of the nitride semiconductor laser device formed on the filmed mask substrate usable in the present invention.

Referring to FIG. 12 analogous to FIG. 5, the horizontal axis of the graph represents a distance from a mask center (c) of filmed mask substrate 100b to a ridge stripe edge (a) in the width direction, and the vertical axis represents the lasing lifetime. Here, the distance from the mask center (c) to the ridge stripe edge (a) (hereinafter, called c-a distance) is expressed by the positive value on the right side of the mask center (c) in the width direction and by the negative value on the left side thereof. Further, the lasing lifetime is determined as a time period when the threshold current increases from an initial value to 1.5 times of the initial value after the laser device is set in a lifetime testing apparatus. The nitride semiconductor laser device measured in FIG. 12 is structured and produced similarly as in the case of the seventh embodiment as will be described later. Further, the ridge stripe width (RSW), the mask width (MW), the window width (WW), and the thickness of mask 200 are set to 2 μm, 18 μm, 8 μm, and 0.1 μm, respectively.

As seen from FIG. 12, the lasing lifetime of the nitride semiconductor laser device tends to extend more in the case that the ridge stripe portion is formed above mask 200 than in the case that it is formed above the window. According to a result of detailed investigation, it has been found that the lasing lifetime is decreased dramatically (to a few hundred hours to less than 1000 hours) when the ridge stripe portion is formed in a region above the mask where the c-a distance is more than −3 μm and less than 1 μm. Here, when the c-a distance of −3 μm is expressed in terms of a distance from the mask center (c) to a ridge stripe edge (b) (hereinafter, called c-b distance) taking account of the ridge stripe width (RSW) of 2 μm, the c-b distance becomes −1 μm. This means that the lasing lifetime is decreased remarkably when the ridge stripe portion of the nitride semiconductor laser device is formed such that at least a part thereof is included in a range of less than 1 μm on each side of the mask center (c) in the width direction.

The region where the lasing lifetime is decreased dramatically (i.e., the range of less than 1 μm on each side of the mask center (c) in the width direction) is called a region BIII. As such, the ridge stripe portion of the nitride semiconductor laser device is preferably formed such that its entire portion (a-b width) is included in a range other than region BIII. It is more preferable that the ridge stripe portion is formed within a region more than 2 μm away from the mask center (c) in the width direction. In this case, it can be considered that the width of region BIII is less than 4 μm, and a lasing lifetime of at least about 3000–5000 hours can be obtained. Further, it is still more preferable to form the ridge stripe portion within a region more than 3 μm away from the mask center (c) in the width direction. In this case, the width of region BIII can be considered as less than 6 μm, and a lasing lifetime of at least about 10000 hours can be obtained. Here, in the mask width range, a range outside region BIII including the mask center (c) is called a region BI. The region BI corresponds to a region where a nitride semiconductor laser device having a longer lasing lifetime can be formed even compared to such a region BII as will be described later.

The description for the region above the mask is also applicable to the region above the window. Specifically, the lasing lifetime of the nitride semiconductor laser device is decreased dramatically when the ridge stripe portion of the laser device is formed in a region where the c-a distance is more than 10 μm and less than 14 μm. Here, when the c-a distance of 10 μm is expressed in terms of a distance from a window center (d) to the ridge stripe edge (b) (hereinafter, called d-b distance) taking account of the ridge stripe width (RSW) of 2 μm, the d-b distance becomes 1 μm. Similarly, when the c-a distance of 14 μm is expressed in terms of a distance from the window center (d) to the ridge stripe edge (a) (hereinafter, d-a distance), the d-a distance becomes 1 μm. In other words, the lasing lifetime is decreased considerably when the ridge stripe portion of the nitride semiconductor laser device is formed such that at least a part thereof is included in a range of less than 1 μm on each side of the window center (d) in the width direction. The region (in the range of less than 1 μm on each side of the window center (d)) where the lasing lifetime is decreased dramatically is called a region BIV.

Thus, it is preferable to form the ridge stripe portion of the nitride semiconductor laser device such that its entire portion (a-b width) is included in a range other than region BIV. It is more preferable that the ridge stripe portion is formed in a region more than 2 μm away from the window center (d) in the width direction. In this case, the width of region BIV can be considered as less than 4 μm. Here, in the window width range, a region outside the region BIV including the window center (d) is called a region BII. The nitride semiconductor laser device having its ridge stripe portion formed on this region BII exhibited a sufficiently long lasing lifetime of a few thousand hours, though it is shorter than in the case of the above-described region BI.

Figure 13:
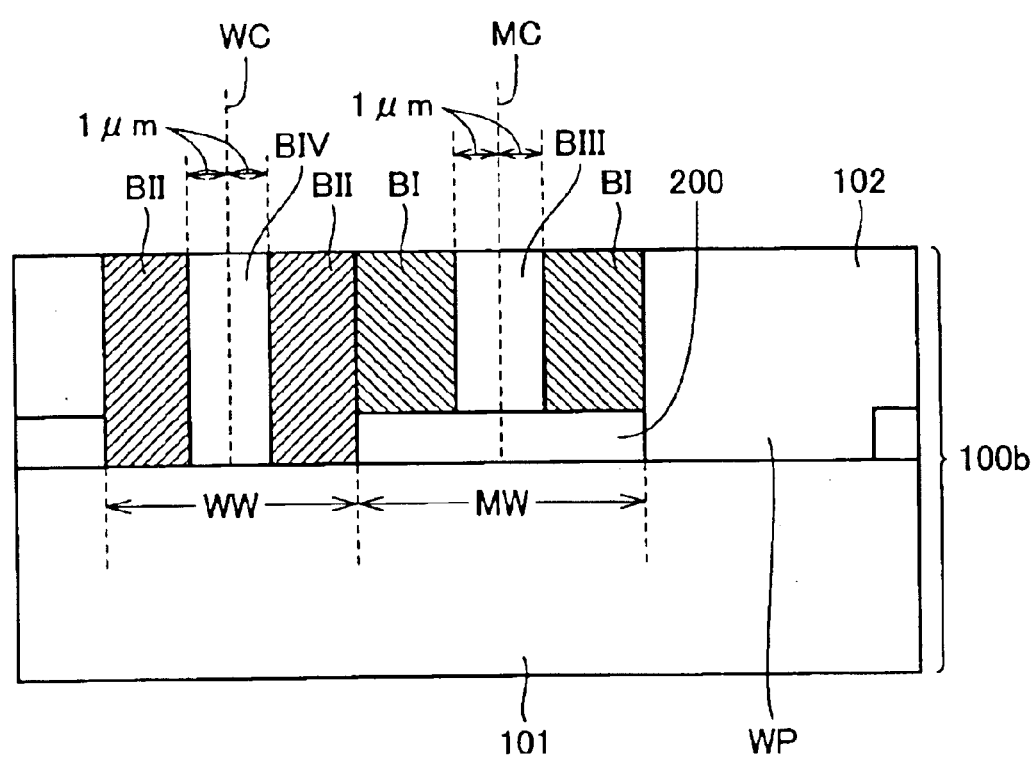
FIG. 13 is a schematic cross sectional view showing regions suitable for forming a current-constricting portion above the filmed mask substrate usable in the present invention.

The above-described results are schematically shown in FIG. 13, in which regions BI through BIV are shown in the schematic diagram of the filmed mask substrate of the present embodiment. That is, over filmed mask substrate 100b of the present embodiment, the ridge stripe portion of the nitride semiconductor laser device is preferably formed avoiding at least regions BIII and BIV (i.e., in regions BI and BII). In particular, the ridge stripe portion is formed most preferably in region BI, next preferably across regions BI and BII, and then next preferably in region BII. The reason why the lasing lifetime changes depending on the position of the ridge stripe portion is considered that the degree of alleviation of crystal strain of the light emitting device structure changes depending on the position over the filmed mask substrate. According to a result of detailed investigation of the inventors, the ridge stripe portion formed across regions BI and BII can improve the lasing lifetime as well as effectively suppress decrease of the yield of the laser devices due to occurrence of cracks in the ridge stripe portion.

The relation as shown in FIG. 12 is obtained even if the ridge stripe width (RSW) is other than 2 μm. Further, the relation between the position of the ridge stripe portion and the lasing lifetime in the sixth embodiment is obtained not only with the nitride semiconductor laser device having the ridge stripe structure (see FIG. 4A), but also with the nitride semiconductor laser device including the current-blocking layer (see FIG. 4B), similarly as in the case of the first embodiment.

(Mask Width)

The width (MW) of mask 200 formed in mask substrate 100b is preferably more than 5 μm and less than 30 μm, and more preferably more than 9 μm and less than 25 μm. The lower and upper limits of the mask width (MW) are estimated as follows. When the current-constricting portion of the nitride semiconductor laser device is formed above a region within the mask width, the lower limit of the mask width depends on the width of the current-constricting portion (current-constricting width). It is preferable, from the standpoint of a longer lasing lifetime described above, that the current-constricting portion is formed in region BI (see FIG. 13). Thus, the lower limit of the mask width needs to be at least wider than the current-constricting width. The current-constricting width can be formed within the range of about 1.5–3 μm. Thus, it is estimated that the lower limit of the mask width should be at least more than 5 μm which corresponds to a sum of the 2 μm width of region BIII and the stripe width (1.5 μm)×2. Further, it is estimated that the lower limit of the mask width is more preferably more than 9 μm as a sum of the extended 6 μm width of region BIII and the stripe width (3 μm)×2.

On the other hand, the upper limit of the mask width is not set specifically. To completely cover the masks on the mask substrate with the nitride semiconductor underlayer, however, the mask width is preferably less than 30 μm and more preferably less than 25 μm. In addition, it is preferable that the mask width (MW) is wider than the width (WW) of the window portion (WP) formed in the mask substrate. In such a case, the region BI most preferable for forming the current-constricting portion becomes wider, allowing a larger number of nitride semiconductor laser devices to be formed therein, and the rate of defective nitride semiconductor laser devices also decreases advantageously.

(Window Width)

In the case that the current-constricting portion is formed above a region within the window width (WW) (i.e., in region BII), the lower limit of the window width (WW) is estimated similarly as in the case of the above-described mask width (MW), and is preferably more than 4 μm. In the case that a part of the current-constricting portion is included in a region above the mask, the lower limit of the window width may be more than 2 μm, corresponding to the width of region BIV,. Although the upper limit of the window width is not set specifically, it is preferably less than 20 μm and more preferably less than 10 μm, since the effect of alleviating crystal strain decreases as the window width increases.

(Mask Stripe Direction)

The longitudinal direction of the mask formed on a nitride semiconductor substrate having a main surface of a {0001} C plane is most preferably in parallel with the <1-100> direction, and next preferably in parallel with the <11-20> direction. Even when the longitudinal direction of the mask made an angle of the order of within ±5 degrees with such a specific direction in the {0001} C plane, it did not cause any substantial effect.

Formation of the mask in the <1-100> direction of the nitride semiconductor substrate is advantageous in that the effects of suppressing crystal strain and occurrence of cracks are very high. When a nitride semiconductor underlayer is grown to cover the masks formed in that direction, underlayer 102 covers masks 200 while forming primarily the {11-20} facets (FP1) thereon. The {11-20} facet plane is perpendicular to the main surface of substrate 101, and mask 200 is formed of a growth inhibiting film suppressing epitaxial growth thereon. Thus, nitride semiconductor underlayer 102 grows from the {11-20} facets. It is considered that the remarkable effects of suppressing the crystal strain and occurrence of the cracks are obtained because nitride semiconductor underlayer 102 grows in a direction parallel to the main surface of substrate 101 (hereinafter, called lateral growth). Further, the feature of the longitudinal direction of the masks in the <1-100> direction can be combined with the feature of the optimal position for the current-constricting portion to achieve a still longer lasing lifetime.

Figure 14A:
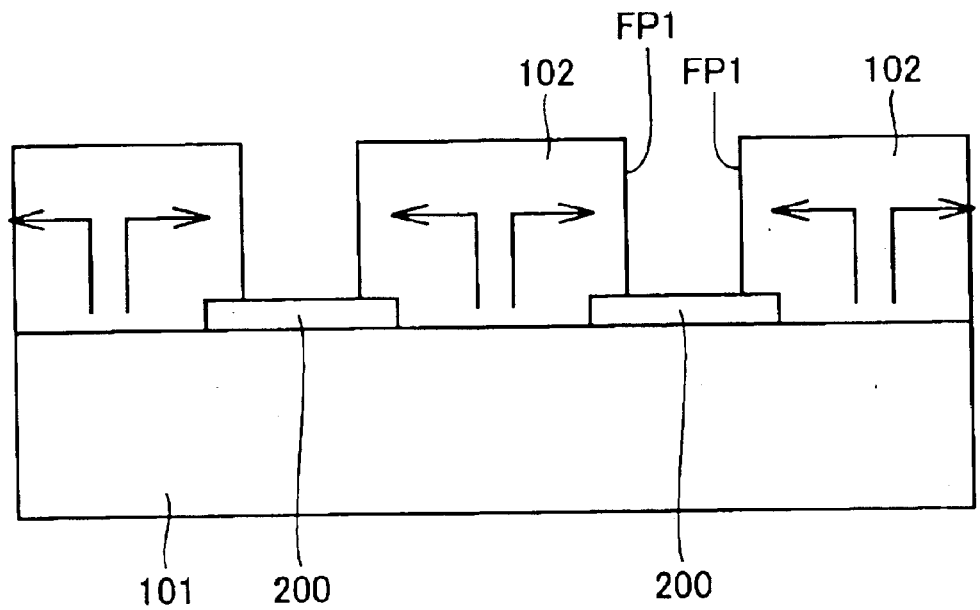
FIGS. 14A and 14B are schematic cross sectional views showing growth of nitride semiconductor films on mask substrates.
Figure 14B:
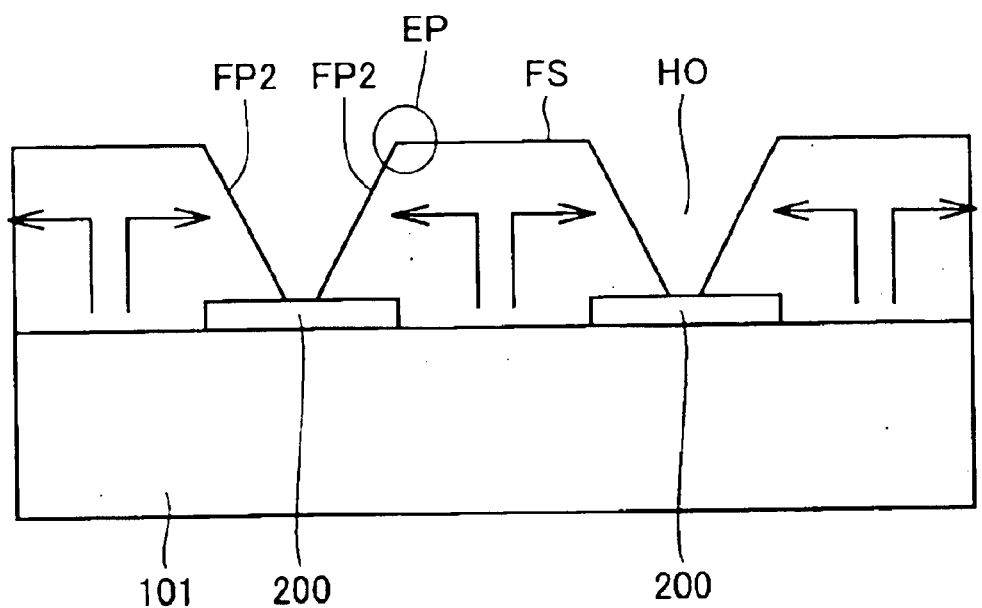

On the other hand, formation of the mask in the <11-20> direction of the nitride semiconductor substrate is advantageous in that, when the mask is covered with the nitride semiconductor underlayer, good surface morphology of the underlayer is ensured above the mask. When the nitride semiconductor underlayer grows over the masks formed in that direction, the underlayer forms primarily the {1-101} facets (FP2) while covering masks 200. The {1-101} facet plane is extremely flat, and the edge portion (EP) where the facet plane (FP2) comes into contact with the upper surface (FS) of the underlayer is also extremely sharp. Thus, the depression (HO) formed in the <11-20> direction as shown in FIG. 14B hardly meanders when seen from above. The nitride semiconductor underlayer has good surface morphology in the region above the mask thus covered. With the good surface morphology of the underlayer of nitride semiconductor film, it is favorably possible to decrease the rate of defective nitride semiconductor laser devices each having the current-constricting portion formed in region BI.

The above-described masks and windows all have stripe shapes, which is advantageous in the following point. The current-constricting portion of the nitride semiconductor laser device has a stripe shape. Thus, if the position optimal for forming the current-constricting portion (regions BI and BII) also has a stripe shape, it becomes possible to readily form the current-constricting portion in regions BI and BII.

(Nitride Semiconductor Underlayer)

GaN film, AlGaN film, or InGaN film, for example, may be employed as the underlayer of nitride semiconductor film covering the mask substrate in the sixth embodiment, similarly as in the case of the first embodiment. Further, the nitride semiconductor underlayer may include at least one impurity selected from the impurity group of Si, O, Cl, S, C, Ge, Zn, Cd, Mg and Be.

When the nitride semiconductor underlayer is formed of the GaN film, it can be formed in good controllability of crystal growth, since the GaN film is a binary mixed crystal. Further, lateral growth of the underlayer is promoted, and crystal strain within the nitride semiconductor film covering the mask can be alleviated. The GaN film used as the nitride semiconductor underlayer preferably has an impurity concentration of more than $1 \times 10^{17}/cm^3$ and less than $8 \times 10^{18}/cm^3$. Addition of the impurity in this concentration range ensures good surface morphology of the nitride semiconductor underlayer and uniform thickness of the light emitting layer, thereby improving the characteristics of the device.

When the nitride semiconductor underlayer is formed of the AlGaN film, the surface migration length is short. Thus, a void is unlikely to be formed above the mask when the AlGaN film covers the mask substrate. This can reduce the rate of occurrence of cracks and improve the lasing lifetime. Further, in the case of the AlGaN film, the nitride semiconductor film is likely to crystal-grow from the sidewalls of the facets explained in conjunction with FIGS. 14A and 14B. As such, lateral growth becomes more prominent with crystal strain being alleviated, and as a result, the lasing lifetime can be improved.

The Al composition ratio x of the $Al_xGa_{1-x}N$ film is preferably greater than 0.01 and less than 0.15, and more preferably greater than 0.01 and less than 0.07. If the Al composition ratio x is too small, it is difficult to suppress occurrence of the void. If it is too great, the effect of alleviating the crystal strain may not be obtained. Further, the AlGaN film used as the nitride semiconductor underlayer preferably has an impurity concentration of more than $3 \times 10^{17}/cm^3$ and less than $8 \times 10^{18}/cm^3$. Addition of the impurity in this concentration range in addition to Al ensures a properly short surface migration length of the nitride semiconductor underlayer, in which case the crystal strain can further be alleviated.

When the nitride semiconductor underlayer is formed of the InGaN film, dependency of lasing lifetime on the position where the current-constricting portion is formed can be made small, since the InGaN film superior in elasticity covers the mask substrate. This can reduce the rate of defective nitride semiconductor laser chips (in that the lasing lifetime becomes shorter than the guaranteed lifetime). The In composition ratio x of the $In_xGa_{1-x}N$ film is preferably greater than 0.01 and less than 0.18, and more preferably greater than 0.01 and less than 0.1. Further, the InGaN film used as the nitride semiconductor underlayer preferably has an impurity concentration of more than $1 \times 10^{17}/cm^3$ and less than $4 \times 10^{18}/cm^3$. Addition of the impurity in this concentration range as well as In is advantageous in that the surface morphology of the nitride semiconductor underlayer becomes favorable and the elasticity can also be maintained.

(Thickness of Nitride Semiconductor Underlayer)

To completely cover the mask substrate with the nitride semiconductor underlayer, thickness of the nitride semiconductor underlayer is preferably more than about 2 μm and less than 30 μm, similarly as in the case of the first embodiment.

[Seventh Embodiment]

In a seventh embodiment, explanation is given for a method of forming a nitride semiconductor laser chip having a ridge stripe structure formed on a filmed mask substrate.

The matters not specifically explained in the present embodiment are similar to those in the sixth embodiment described above.

(Method of Forming Filmed Mask Substrate)

In FIG. 10, a mask substrate 101m including masks 200 formed on a GaN substrate 101 is shown with a top plan view and a cross sectional view. Masks 200 each have a prescribed mask width (MW), and they are arranged at intervals of a window width (WW). In FIG. 10, the window portion is denoted by WP, the mask center and the window center are denoted by MC and WC respectively, and the mask stripe direction is indicated by an arrow (MSD). A schematic cross sectional view of FIG. 11 shows a mask substrate including masks 200 formed on GaN substrate 101, and a filmed mask substrate 100b having an n type $Al_{0.03}Ga_{0.97}N$ underlayer 102 covering the mask substrate.

Firstly, a growth inhibiting film of $SiO_2$ is formed to a thickness of 0.1 μm on a (0001) main surface of GaN substrate 101 by electron beam evaporation (EB method) or by sputtering. Thereafter, stripe masks 200 of $SiO_2$ are formed by lithography in the <1-100> direction of GaN substrate 101. Here, stripe masks 200 were formed with a mask width (MW) of 13 μm and a window width (WW) of 7 μm. Mask substrate 100m of the present embodiment is thus completed.

The mask substrate is subjected to organic cleaning thoroughly, and then transferred into the MOCVD system. $NH_3$ as a source material for the group V element and TMGa and TMAl as source materials for the group III elements are supplied over the mask substrate, and $SiH_4$ (Si impurity concentration: $1 \times 10^{18}/cm^3$) as an impurity is added to the source materials, to grow a 15 μm thick n type $Al_{0.03}Ga_{0.97}N$ underlayer 102 at a crystal growth temperature of 1050° C. The filmed mask substrate 100b of the present embodiment is thus completed (see FIG. 11).

The growth inhibiting film may be formed of $SiN_x$, $Al_2O_3$ or $TiO_2$, besides $SiO_2$. The longitudinal direction of the stripe masks may be in the <11-20> direction of GaN substrate 101, instead of the <1-100> direction thereof. Further, although GaN substrate 101 having its main surface of a (0001) plane has been used as the nitride semiconductor substrate in the present embodiment, it is possible to employ another nitride semiconductor substrate and another plane orientation. As to the orientation of the main surface of the substrate, a C plane {0001}, an A plane {11-20}, an R plane {1-102}, an M plane {1-100} or a {1-101} plane may be employed preferably. Good surface morphology is obtained with any substrate having the main surface with an off-angle within 2 degrees from any of these plane orientations. In the case of a nitride semiconductor laser, it is preferable that a layer having a refractive index lower than that of a clad layer is in contact with the outside of the clad layer to obtain a unimodal vertical transverse mode, and thus an AlGaN substrate, for example, may be employed preferably as another nitride semiconductor substrate.

(Crystal Growth)

Figure 9:
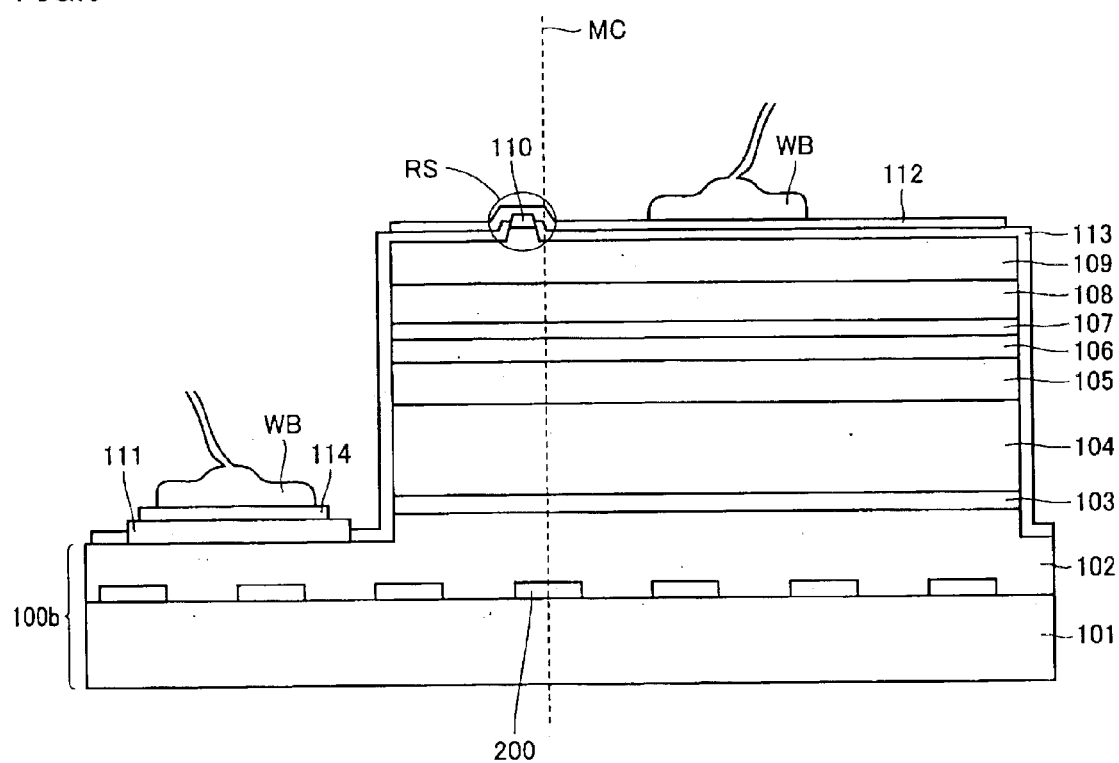
FIG. 9 is a schematic cross sectional view showing an example of a nitride semiconductor laser device including a ridge stripe structure formed on a mask substrate according to the present invention.

FIG. 9 shows a nitride semiconductor laser chip grown on a filmed mask substrate 100b. This nitride semiconductor laser chip includes a filmed mask substrate 100b including masks 200 on a GaN substrate 101 and an n type $Al_{0.03}Ga_{0.97}N$ underlayer 102, an n type $In_{0.07}Ga_{0.93}N$ anti-crack layer 103, an n type $Al_{0.1}Ga_{0.9}N$ clad layer 104, an n type GaN light guide layer 105, a light emitting layer 106, a p type $Al_{0.3}Ga_{0.7}N$ carrier block layer 107, a p type GaN light guide layer 108, a p type $Al_{0.1}Ga_{0.9}N$ clad layer 109, a p type GaN contact layer 110, an n electrode 111, a p electrode 112, a $SiO_2$ dielectric film 113, and an n type electrode pad 114.

In formation of such a nitride semiconductor laser device of the seventh embodiment, conditions and effects of forming n type $In_{0.07}Ga_{0.93}N$ anti-crack layer 103 to p type GaN contact layer 110 over mask substrate 100b were similar to those in the second embodiment.

(Processing Into Chips)

The epi-wafer obtained by the above-described crystal growth (i.e., wafer having nitride semiconductor multiple layer epitaxial-grown on the filmed mask substrate) is taken out of the MOCVD system and processed into semiconductor laser chips. Here, the surface of the epi-wafer having the nitride semiconductor laser device layer formed therein is flat, and the masks and windows included in the mask substrate are completely covered with the nitride semiconductor underlayer and the light emitting device structure layer.

A part of n type $Al_{0.03}Ga_{0.97}N$ underlayer 102 is exposed by dry etching, and Hf and Al are deposited in this order on the exposed part to form n electrode 111. N electrode pad 114 of Au is formed on n electrode 111 by evaporation. Ti/Al, Ti/Mo, Hf/Au or the like may also be used as the materials for the n electrode. Hf is preferably used for the n electrode to decrease the contact resistance of the n electrode.

Figure 15:
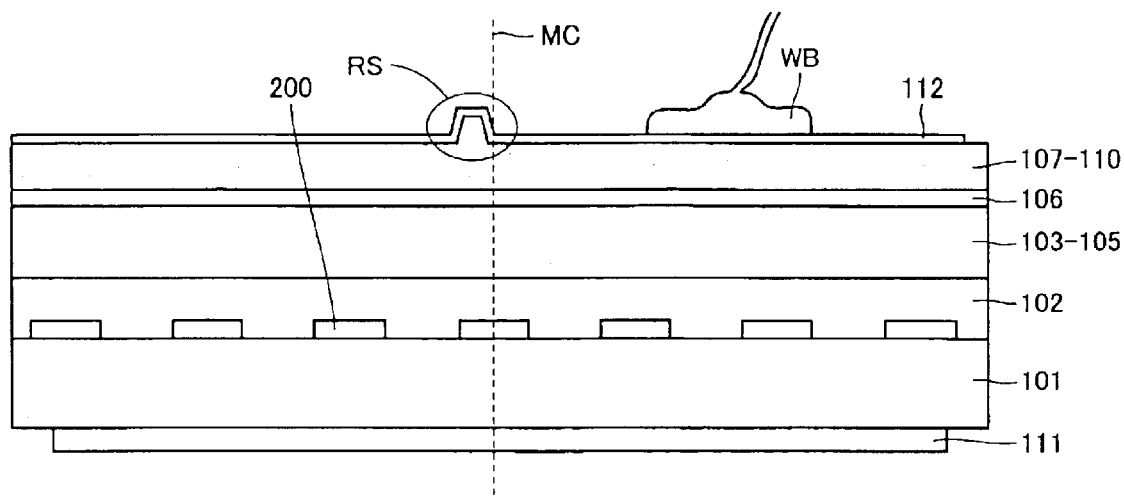
FIG. 15 is a schematic cross sectional view showing another example of the nitride semiconductor laser device including the ridge stripe structure formed on the mask substrate according to the present invention.

The n electrode may be formed on the back side of the mask substrate (see FIG. 15), since the mask substrate is formed of nitride semiconductor. In such a case, the nitride semiconductor substrate 101 should be doped with an impurity such that it has an n type conductivity.

The p electrode portion is etched in a stripe manner in the longitudinal direction of mask 200, to form a ridge stripe portion (see FIG. 9). The ridge stripe portion (RS) is formed above mask 200 to have a width of 1.7 μm, at a position 4 μm away from the mask center in the mask width direction such that it is not located just above the mask center (MC). That is, the ridge stripe is formed avoiding region BIII. Thereafter, $SiO_2$ dielectric film 113 is formed by evaporation, and an upper surface of p type GaN contact layer 110 is exposed from the dielectric film. On the exposed surface of the contact layer, p electrode 112 is formed with stacked layers of Pd/Mo/Au by evaporation. Stacked layers of Pd/Pt/Au, Pd/Au, Ni/Au or the like may also be used for the p electrode.

The resonators formed by cleavage and the reflection films formed on the end surfaces according to the present embodiment are similar to those in the second embodiment. The nitride semiconductor laser chip after chip division had a width of 500 μm.

(Packaging).

For a nitride semiconductor laser chip of high output (greater than 30 mW), attention should be paid to measures for heat dissipation. For example, a high output laser chip is preferably connected with being junction-down to a package body by using an In soldering material. Alternatively, the high output laser chip may be connected via a sub-mount of Si, AlN, diamond, Mo, CuW, BN, Fe, Cu, SiC, or Au, instead of being directly attached to the package body or a heat sink portion.

In the seventh embodiment, a lasing lifetime of about 13000 hours can be obtained by forming the current-constricting portion of the nitride semiconductor laser device in the optimal position over the mask substrate. The mask width and the window width of the mask substrate explained in the seventh embodiment may be set to other numerical values, as long as the conditions explained in the sixth embodiment are satisfied. The same applies to the following embodiments.

[Eighth Embodiment]

An eighth embodiment is similar to the sixth and seventh embodiments except that the nitride semiconductor laser chip having a ridge stripe structure as described in the seventh embodiment is changed to a nitride semiconductor laser chip including a current-blocking structure (FIG. 8).

The nitride semiconductor laser chip including a current-blocking layer of the present embodiment shown in FIG. 8 includes a filmed mask substrate 100b, an n type $In_{0.07}Ga_{0.93}N$ anti-crack layer 103, an n type $Al_{0.1}Ga_{0.9}N$ clad layer 104, an n type GaN light guide layer 105, a light emitting layer 106, a p type $Al_{0.2}Ga_{0.8}N$ carrier block layer 107, a p type GaN light guide layer 108, a p type $Al_{0.1}Ga_{0.9}N$ first clad layer 109a, a pair of current-blocking layers 120, a p type $Al_{0.1}Ga_{0.9}N$ second clad layer 109b, a p type GaN contact layer 110, an n electrode 111, and a p electrode 112.

That is, the laser chip of the eighth embodiment differs from that of the third embodiment in that covered processed substrate 100a is replaced with filmed mask substrate 100b. In the eighth embodiment, the mask width, the window width, the mask thickness, and the width (CSW) of a gap between the current-blocking layers were set to 10 μm, 5 μm, 0.1 μm, and 1.8 μm, respectively. The gap between the current-blocking layers was arranged 3 μm away from the center of the mask (i.e., within region BI). The effects obtained in the eighth embodiment were similar to those in the sixth embodiment.

[Ninth Embodiment]

A ninth embodiment is similar to the sixth through eighth embodiments except that masks are formed on a nitride semiconductor improved substrate including a nitride semiconductor base substrate and a nitride semiconductor layer formed thereon. In formation of the filmed mask substrate of the ninth embodiment, the method of forming the nitride semiconductor improved substrate is similar as in the case of the fourth embodiment.

On the nitride semiconductor improved substrate, a growth inhibiting film of $SiN_x$ is formed to a thickness of 0.15 μm by sputtering. Thereafter, stripe masks of $SiN_x$ are formed in the <1-100> direction of the GaN improved substrate by lithography. Here, the mask width was set to 8 μm, and the window width was set to 2 μm.

The mask substrate is subjected to organic cleaning thoroughly, and then transferred into the MOCVD system, to grow a GaN underlayer to a thickness of 20 μm. Specifically, $NH_3$ as a source material for the group V element, TMGa as a source material for the group III element, and $SiN_4$ (Si impurity concentration: $1×10^{18}/cm^3$) as a dopant are supplied over the mask substrate, to form the GaN underlayer at a growth temperature of 1050° C. The filmed mask substrate of the ninth embodiment is thus completed. The mask width and the window width formed in the mask substrate explained in the ninth embodiment may of course be set to other numerical values, as long as the conditions explained in the sixth embodiment are satisfied.

[Tenth Embodiment]

A tenth embodiment is similar to the sixth through ninth embodiments except that a substitutional element of at least one of As, P and Sb to substitute for some of N atoms is contained in the light emitting layer. The conditions and effects of the substitution were similar to those in the fifth embodiment.

[Eleventh Embodiment]

In an eleventh embodiment, a nitride semiconductor laser device in the above-described embodiments is applied to an optical apparatus. A nitride semiconductor laser device of violet color (with laser wavelength of 360–420 nm) in the above-described embodiments can preferably be employed in various optical apparatuses, e.g., in an optical pickup apparatus, from the following view point. Such a nitride semiconductor laser device operates stably at high temperature (60° C.) and at high output (30 mW), and has a long lasing lifetime, so that it is optimally applicable to a highly reliable high-density recording/reproducing optical disk apparatus (shorter laser wavelength enables recording/reproduction of higher density).

Figure 16:
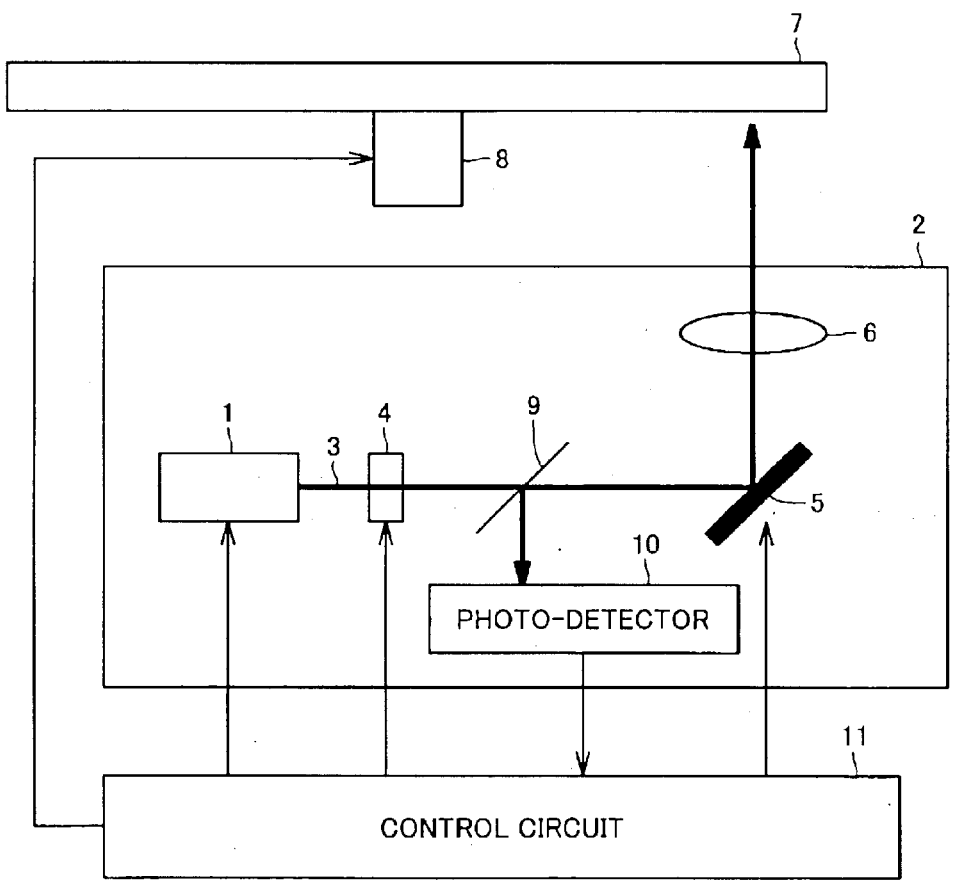
FIG. 16 is a schematic block diagram showing an example of an optical apparatus having an optical pickup including the nitride semiconductor laser device according to the present invention.

In FIG. 16, an optical disk such as a DVD apparatus including an optical pickup is shown in a schematic block diagram as an example of using a nitride semiconductor laser device of the above embodiments in an optical apparatus. In this optical information recording/reproducing apparatus, laser light 3 emitted from a nitride semiconductor laser device 1 is modulated by an optical modulator 4 in accordance with input information, and records the information on a disk 7 via a scan mirror 5 and a lens 6. Disk 7 is rotated by a motor 8. At the time of reproduction, reflected laser light optically modulated by bit arrangement on disk 7 is detected by a detector 10 via a beam splitter 9, and a reproduced signal is obtained. Operations of the respective elements are controlled by a control circuit 11. The output of laser device 1 is normally on the order of 30 mW during recording and on the order of 5 mW during reproduction.

Laser devices according to the above embodiments can be used not only for the above-described optical disk recording/reproducing apparatus, but also for a laser printer, a bar code reader, a projector including lasers of optical three primary colors (blue, green, read), and others.

INDUSTRIAL APPLICABILITY

As described above, according to the present invention, it is possible to improve a lasing lifetime of a nitride semiconductor laser device.

What is claimed is:

1. A nitride semiconductor laser device, comprising:
a processed substrate (101a) including a groove and a hill formed on a main surface of a nitride semiconductor substrate;
a nitride semiconductor underlayer (102) covering the groove and the hill of said processed substrate; and
a light emitting device structure having a light emitting layer (106) including a quantum well layer or a quantum well layer and a barrier layer in contact with the quantum well layer between an n type layer (103–105) and a p type layer (107–110) over said nitride semiconductor underlayer,
a current-constricting portion (RS) of said light emitting device structure being formed above a region more than 1 μm away from the center of said groove in the width direction and more than 1 μm away from the center of said hill in the width direction.

2. The nitride semiconductor laser device according to claim 1, wherein said current-constricting portion is formed above a region more than 1 μm away from the center of said groove in the width direction and within the width of said groove.

3. The nitride semiconductor laser device according to claim 1, wherein said current-constricting portion is formed above a region more than 1 μm away from the center of said groove in the width direction and across the groove and the hill.

4. The nitride semiconductor laser device according to claim 1, wherein at least either of the width of said groove and the width of said hill is in a range of 4–30 μm.

5. The nitride semiconductor laser device according to claim 1, wherein the width of said groove is wider than the width of said hill.

6. The nitride semiconductor laser device according to claim 1, wherein said groove has a depth in a range of 1–10 µm.

7. The nitride semiconductor laser device according to claim 1, wherein said nitride semiconductor underlayer is formed of GaN containing at least one impurity selected from Si, O, Cl, S, C, Ge, Zn, Cd, Mg and Be in a range from $1 \times 10^{17}/cm^3$ to $5 \times 10^{18}/cm^3$.

8. The nitride semiconductor laser device according to claim 1, wherein said nitride semiconductor underlayer includes $Al_xGa_{1-x}N$ ($0.01 \leq x \leq 0.15$).

9. The nitride semiconductor laser device according to claim 1, wherein said nitride semiconductor underlayer includes $In_xGa_{1-x}N$ ($0.01 \leq x \leq 0.18$).

10. The nitride semiconductor laser device according to claim 1, wherein said quantum well layer contains at least one of As, P and Sb.

11. A nitride semiconductor laser device, comprising:

a mask substrate (101*m*) including a mask pattern formed on a main surface of a nitride semiconductor substrate, said mask pattern including a plurality of stripe masks (200) and a plurality of stripe windows arranged alternately, each said mask being formed of a growth inhibiting film for suppressing epitaxial growth of a nitride semiconductor layer thereon, and each said window being unprovided with said growth inhibiting film;

a nitride semiconductor underlayer (102) covering said mask pattern; and a light emitting device structure having a light emitting layer (106) including a quantum well layer or a quantum well layer and a barrier layer in contact with the quantum well layer between an n type layer (103–105) and a p type layer (107–110) over the underlayer, a current-constricting portion (RS) through which substantial electric current is introduced into said light emitting device structure being formed above a region more than 1 µm away from the center of said mask in the width direction and more than 1 µm away from the center of said window in the width direction.

12. The nitride semiconductor laser device according to claim 11, wherein said current-constricting portion is formed above a region more than 1 µm away from the center of said mask in the width direction and within a width of said mask.

13. The nitride semiconductor laser device according to claim 11, wherein said current-constricting portion is formed above a region across said mask and said window.

14. The nitride semiconductor laser device according to claim 11, wherein said mask has a width of more than 5 µm and less than 30 µm.

15. The nitride semiconductor laser device according to claim 11, wherein said window has a width of more than 2 µm and less than 20 µm.

16. The nitride semiconductor laser device according to claim 11, wherein the width of said mask is wider than the width of said window.

17. The nitride semiconductor laser device according to claim 11, wherein said nitride semiconductor underlayer includes $Al_xGa_{1-x}N$ ($0.01 \leq x \leq 0.15$).

18. The nitride semiconductor laser device according to claim 11, wherein said nitride semiconductor underlayer includes $In_xGa_{1-x}N$ ($0.01 \leq x \leq 0.18$).

19. The nitride semiconductor laser device according to claim 11, wherein said quantum well layer contains at least one of As, P and Sb.

20. The nitride semiconductor laser device according to claim 11, wherein said nitride semiconductor substrate contains at least one impurity selected from Si, O, Cl, S, C, Ge, Zn, Cd, Mg and Be in a concentration range of more than $5 \times 10^{17}/cm^3$ and less than $5 \times 10^{18}/cm^3$.

21. The nitride semiconductor laser device according to claim 1, wherein said nitride semiconductor substrate is made of GaN or AlGaN.

22. The nitride semiconductor laser device according to claim 1, wherein said nitride semiconductor substrate has an n type conductivity and then an n electrode including Hf is provided on the other main surface of said nitride semiconductor substrate.

23. The nitride semiconductor laser device according to claim 1, wherein a p electrode including at least one element of Pd, Pt and Mo is provided on said p type layer.

24. The nitride semiconductor laser device according to claim 1, wherein said p type layer includes a GaN contact layer containing Mg as a p type impurity and then a p electrode is provided on said GaN contact layer and wherein concentration of Mg in said GaN contact layer is increased as approaching the interface with said p electrode.

25. The nitride semiconductor laser device according to claim 11, wherein said nitride semiconductor substrate is made of GaN or AlGaN.

26. The nitride semiconductor laser device according to claim 11, wherein said nitride semiconductor substrate has an n type conductivity and then an n electrode including Hf is provided on the other main surface of said nitride semiconductor substrate.

27. The nitride semiconductor laser device according to claim 11, wherein a p electrode including at least one element of Pd, Pt and Mo is provided on said p type layer.

28. The nitride semiconductor laser device according to claim 11, wherein said p type laser includes a GaN contact layer containing Mg as a p type impurity and then a p electrode is provided on said GaN contact layer and wherein concentration of Mg in said GaN contact layer is increased as approaching the interface with said p electrode.

* * * * *